United States Patent
Isaka

(10) Patent No.: US 11,841,623 B2
(45) Date of Patent: Dec. 12, 2023

(54) ILLUMINATION APPARATUS, MEASUREMENT APPARATUS, SUBSTRATE PROCESSING APPARATUS, AND METHOD FOR MANUFACTURING ARTICLE

(71) Applicant: CANON KABUSHIKI KAISHA, Tokyo (JP)

(72) Inventor: Yuki Isaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/935,720

(22) Filed: Sep. 27, 2022

(65) Prior Publication Data
US 2023/0131615 A1    Apr. 27, 2023

(30) Foreign Application Priority Data
Sep. 28, 2021  (JP) ................. 2021-157908

(51) Int. Cl.
*G03F 7/00*   (2006.01)
*G03F 9/00*   (2006.01)

(52) U.S. Cl.
CPC .... *G03F 7/706849* (2023.05); *G03F 7/70091* (2013.01); *G03F 9/7049* (2013.01); *G03F 9/7069* (2013.01)

(58) Field of Classification Search
CPC .. G03F 7/0002; G03F 7/70091; G03F 7/7085; G03F 7/70; G03F 7/70141; G03F 7/7015; G03F 7/70158; G03F 7/70191; G03F 7/7055; G03F 7/70575; G03F 7/70616–70683; G03F 9/7049; G03F 9/70; G03F 9/7065; G03F 9/7088; G03F 9/7092; G03F 9/7096; G03F 7/705; G03F 7/70483; G03F 7/70605–706851
(Continued)

(56) References Cited

U.S. PATENT DOCUMENTS

2009/0303562 A1* 12/2009 Koeppen .................. G01J 3/14
                                                      359/213.1
2011/0267678 A1* 11/2011 Erdogan ............... G02B 26/007
                                                      359/290
(Continued)

FOREIGN PATENT DOCUMENTS

JP    2012037834 A   *  2/2012
JP    2014095594 A      5/2014
(Continued)

OTHER PUBLICATIONS

English translation of JP2012-037834, published Feb. 23, 2012. (Year: 2012).*

*Primary Examiner* — Christina A Riddle
(74) *Attorney, Agent, or Firm* — Canon U.S.A., Inc. IP Division

(57) ABSTRACT

An illumination apparatus configured to provide illumination while changing a spectrum of light from a light source includes a wavelength variable unit configured to change a spectrum of irradiating light, and an optical system configured to irradiate the wavelength variable unit with the light from the light source. The wavelength variable unit is disposed so that an incident surface of the wavelength variable unit on which the light emitted from the optical system is incident is tilted with respect to a plane perpendicular to an optical axis of the optical system.

13 Claims, 14 Drawing Sheets

(58) Field of Classification Search
USPC .................. 355/18, 30, 52–55, 67–77, 133; 356/399–401
See application file for complete search history.

(56) References Cited

U.S. PATENT DOCUMENTS

| | | | |
|---|---|---|---|
| 2014/0240951 A1* | 8/2014 | Brady | F21V 13/14 362/583 |
| 2018/0052099 A1* | 2/2018 | Hill | G01J 3/10 |
| 2019/0041329 A1 | 2/2019 | Hill | |
| 2020/0192231 A1* | 6/2020 | Cramer | G01N 21/956 |

FOREIGN PATENT DOCUMENTS

| | | |
|---|---|---|
| JP | 6568041 B2 | 8/2019 |
| JP | 2019528444 A | 10/2019 |
| JP | 2019196943 A | 11/2019 |

\* cited by examiner

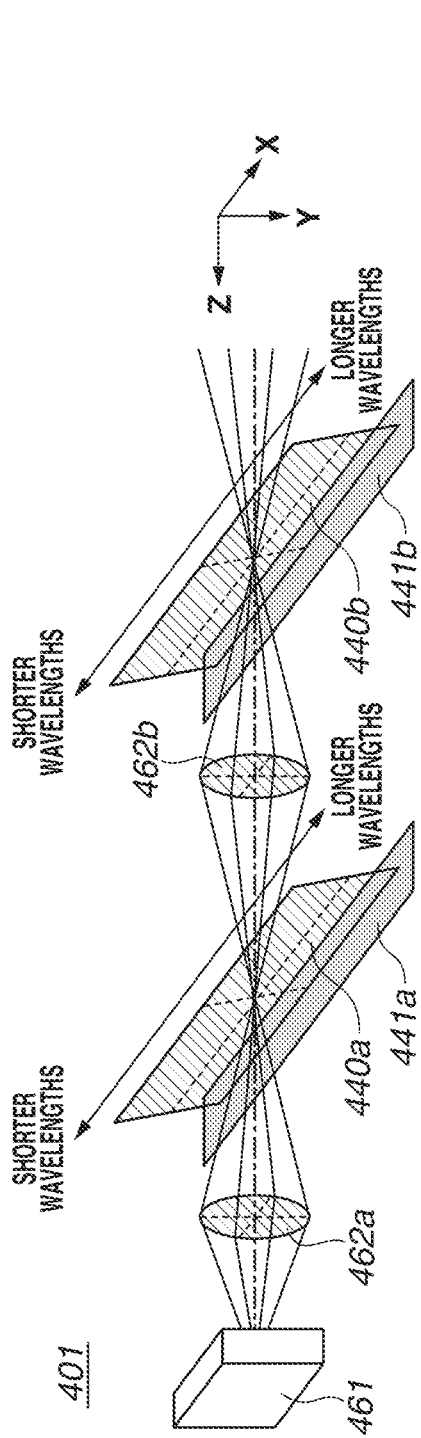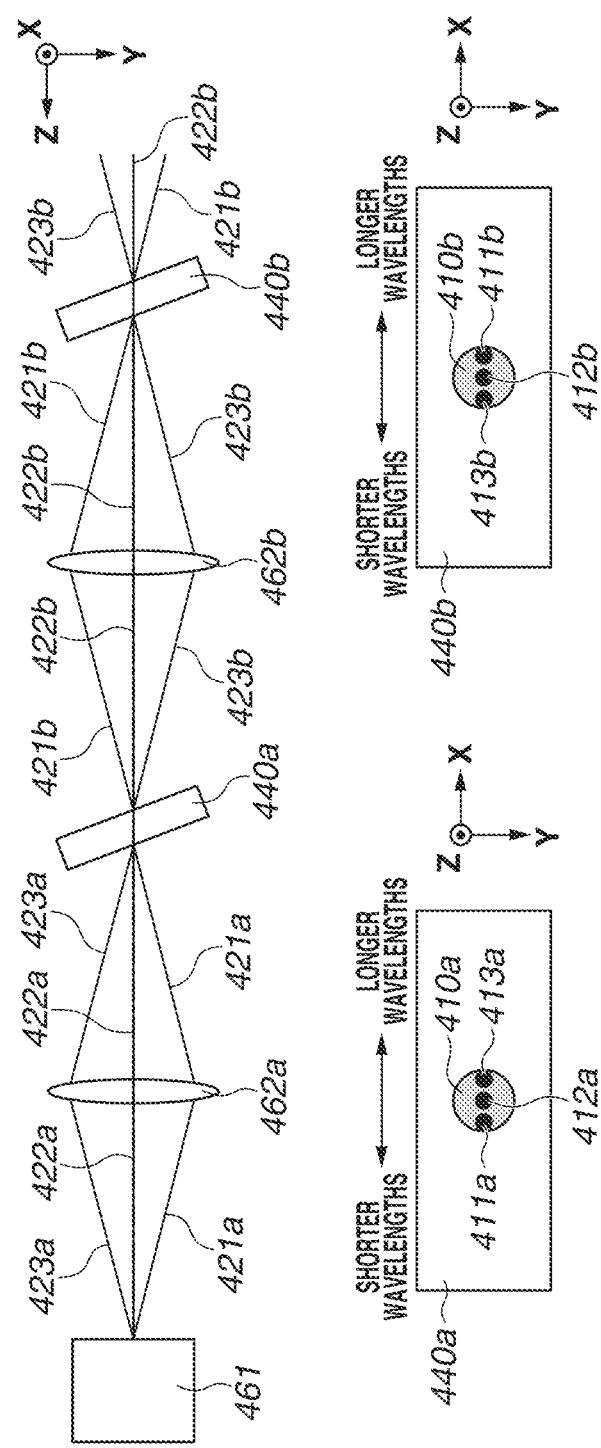

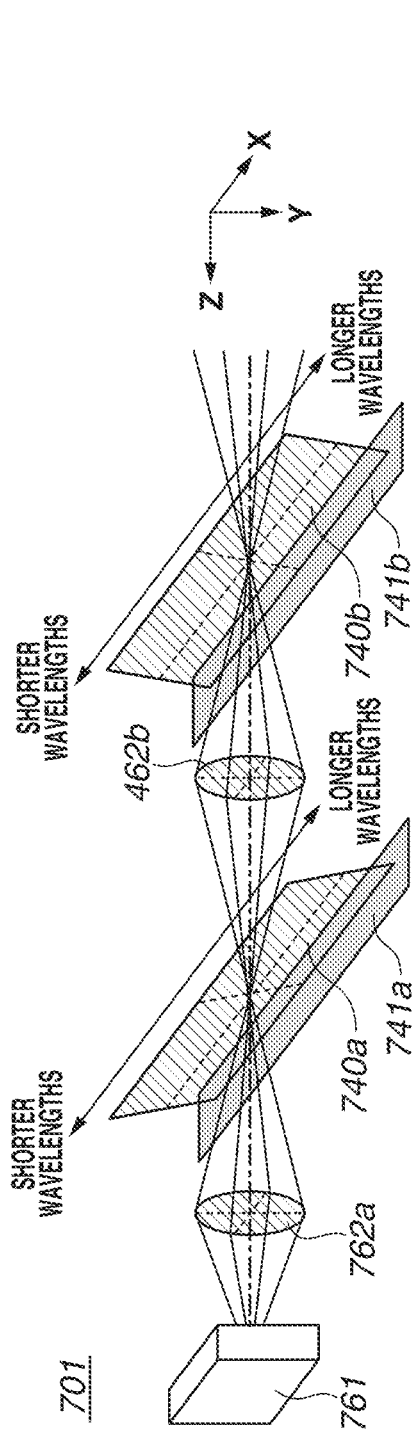
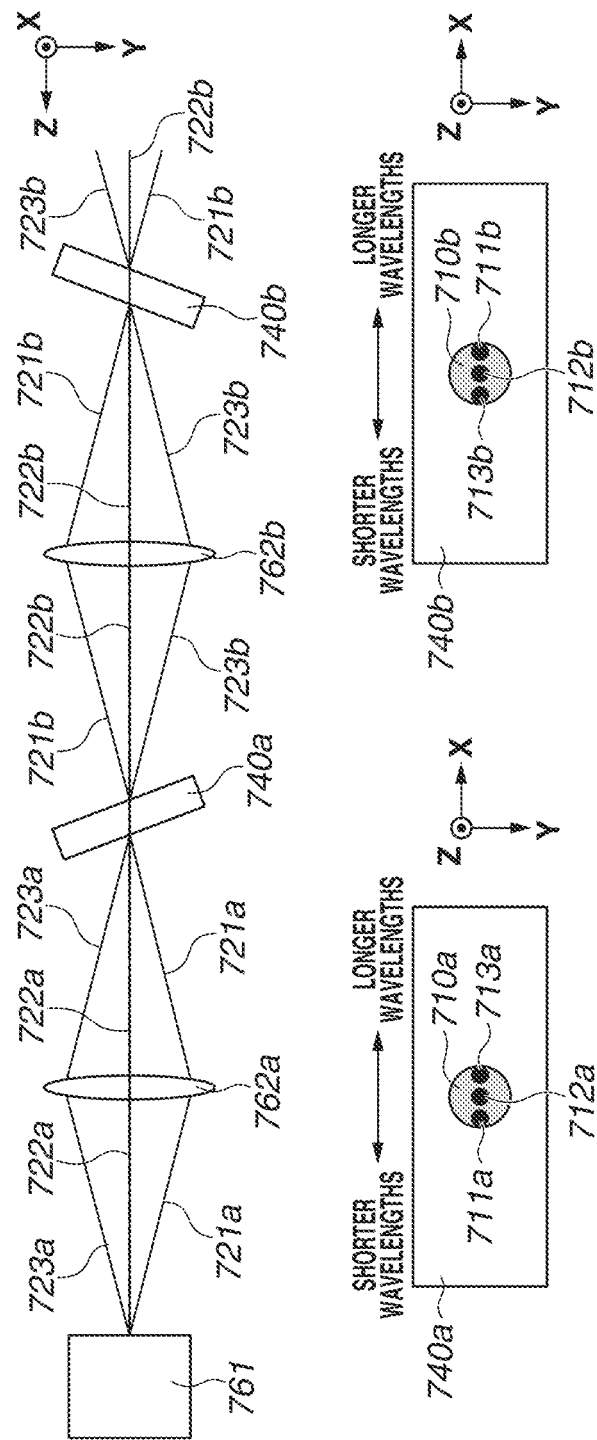
FIG.6A
FIG.6B
FIG.6C

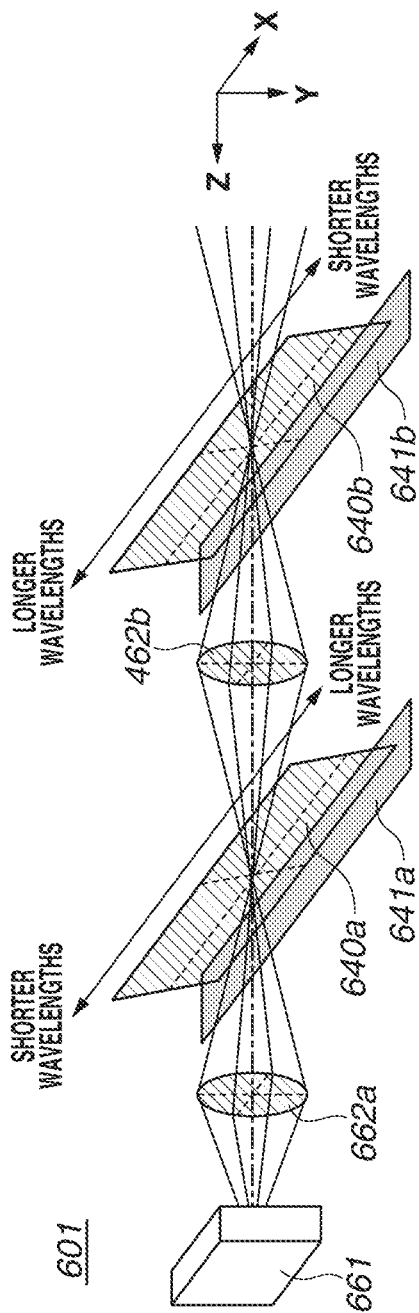
FIG.7A
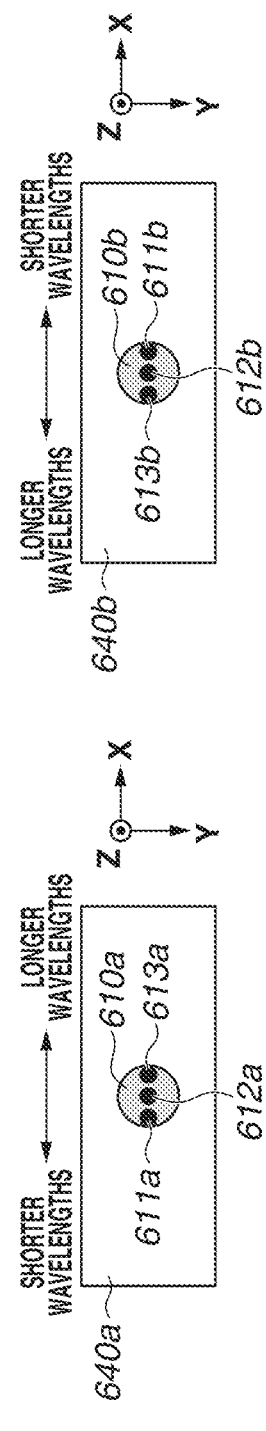
FIG.7B
FIG.7C

ILLUMINATION APPARATUS, MEASUREMENT APPARATUS, SUBSTRATE PROCESSING APPARATUS, AND METHOD FOR MANUFACTURING ARTICLE

BACKGROUND

Field of the Disclosure

The present disclosure generally relates to an illumination apparatus, a measurement apparatus, a substrate processing apparatus, and a method for manufacturing an article.

Description of the Related Art

In manufacturing articles, such as semiconductor devices, microelectromechanical systems (MEMS), color filters, and flat panel displays, patterns to be formed on substrates are getting finer and a demand for an improvement in the dimensional accuracy of the patterns is growing.

Substrate processing apparatuses for processing a substrate therefore desirably have high accuracy in measuring the position of the substrate on which to form a pattern. Among examples of the substrate processing apparatuses is an exposure apparatus that exposes a substrate to light to form a pattern on the substrate. The exposure apparatus forms the pattern on the substrate by focusing exposure light on a predetermined position on the substrate via a projection optical system and moving a stage on which the substrate is placed. The accuracy in measuring the pattern on the substrate to adjust a relative position between the predetermined position on the substrate on which the pattern is formed and the exposure light, and the accuracy in measuring a relative position between patterns formed on different layers of the substrate, are important.

A method of measuring the position of a pattern formed on a substrate (hereinafter, referred to simply as a pattern) includes illuminating the pattern and detecting light reflected by the pattern. A method of more accurately measuring a pattern includes selecting the wavelength of the light to illuminate the pattern with based on physical and optical characteristics of the pattern and the vicinities of the pattern. The physical properties of the material constituting the pattern and the shape of the pattern vary depending on the process for processing the substrate. Illuminating the pattern with the light of wavelength selected based on the process for processing the substrate thus improves the intensity of the detection signal of the light reflected from the pattern, reduces errors in the detection signal, and improves the accuracy of the position measurement of the pattern.

Japanese Patent No. 6568041 discusses an imaging system configured to capture an image of a sample, wherein the wavelength of light to irradiate the sample with is changed and the sample is imaged in synchronization with a change in the wavelength. A light source apparatus included in the imaging system is discussed to drive a filter and thereby change the wavelength of the light to irradiate the sample with through the filter.

According to Japanese Patent No. 6568041, if the light emitted from the light source is reflected at the surface of the filter, the light source can be irradiated with the reflected light returned. This may degrade the performance and durability of the light source due to an increase in the temperature of the light source.

SUMMARY

The present disclosure is directed to providing an illumination apparatus, a measurement apparatus, a substrate processing apparatus, and a method for manufacturing an article that prevent degradation in the performance and duration of a light source.

According to an aspect of the present disclosure, an illumination apparatus configured to provide illumination while changing a spectrum of light from a light source includes a wavelength variable unit configured to change a spectrum of irradiating light, and an optical system configured to irradiate the wavelength variable unit with the light from the light source. The wavelength variable unit is disposed so that an incident surface of the wavelength variable unit on which the light emitted from the optical system is incident is tilted with respect to a plane perpendicular to an optical axis of the optical system.

Further features of the present disclosure will become apparent from the following description of exemplary embodiments with reference to the attached drawings.

BRIEF DESCRIPTION OF THE DRAWINGS

FIGS. 5A to 5C are diagrams illustrating an illumination unit according to a second exemplary embodiment.

FIGS. 6A to 6C are diagrams illustrating an illumination unit according to a first modification of the second exemplary embodiment.

FIGS. 7A to 7C are diagrams illustrating an illumination unit according to a second modification of the second exemplary embodiment.

DESCRIPTION OF THE EMBODIMENTS

Figure 1A:
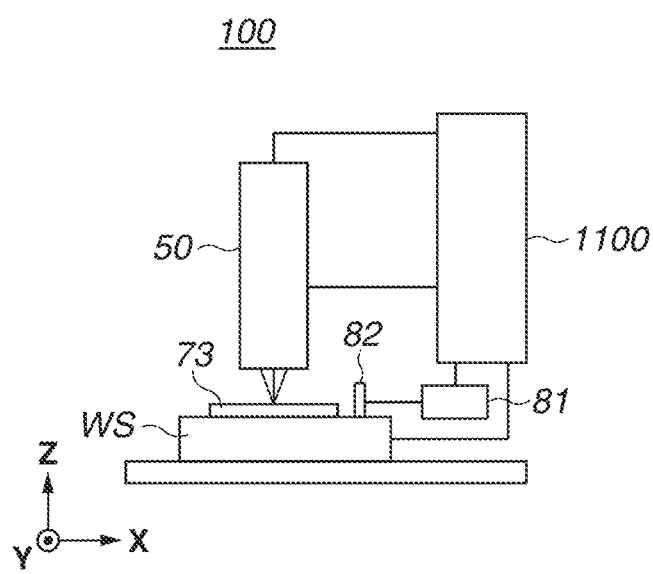
FIGS. 1A to 1D are diagrams illustrating a measurement apparatus according to a first exemplary embodiment.

Exemplary embodiments of the present disclosure will be described in detail below with reference to the accompanying drawings. In the drawings, similar members are denoted by the same reference numerals. A redundant description thereof will be omitted. Note that the present disclosure is not limited to the following exemplary embodiments, which only demonstrate specific examples advantageous in practicing the present disclosure. All combinations of features described in the following exemplary embodiments are not necessarily indispensable for the present disclosure to solve the foregoing issues.

A first exemplary embodiment of the present disclosure will be described below. A measurement apparatus including an illumination unit (illumination apparatus) according to the first exemplary embodiment will initially be described. FIGS. 1A to 1D are diagrams illustrating the measurement apparatus according to the first exemplary embodiment. A direction parallel to an optical axis of an illumination optical system 362 to be described below will hereinafter be referred to as a Z-axis direction. Two mutually orthogonal directions along a plane perpendicular to the Z-axis direction will be referred to as an X-axis direction and a Y-axis direction. The direction of rotation about the X-axis, the direction of rotation about the Y-axis, and the direction of rotation about the Z-axis will be referred to as an ωX-axis direction, an ωY-axis direction, and an ωZ-axis direction, respectively.

FIG. 1A is a diagram illustrating a configuration of a measurement apparatus 100. For example, the measurement apparatus 100 measures the position of a pattern disposed on a substrate 73 in the X- and Y-axis directions. As another example, the measurement apparatus 100 may measure the positions of patterns disposed on respective different layers of the substrate 73 in the X- and Y-axis directions, and measure the distance between the patterns. The measurement apparatus 100 includes a substrate stage WS for holding the substrate 73, a measurement unit 50, and a control unit 1100.

The substrate 73 is an object for which the measurement apparatus 100 is to measure an alignment error or overlay error thereof. For example, the substrate 73 is one that is used to manufacture devices, such as semiconductor elements, liquid crystal display elements, other devices, or combinations thereof. Specific examples include a wafer, a liquid crystal substrate, and/or other substrates to be processed.

The substrate stage WS is configured to hold the substrate 73 via a substrate chuck (not illustrated) and be capable of being driven by a stage driving unit (not illustrated). The stage driving unit includes linear motors and can move the substrate 73 held on the substrate stage WS by driving the substrate stage WS in the X-, Y-, Z-, ωX-, ωY-, and ωZ-axis directions. A mirror 82 is disposed on the substrate stage WS. A laser interferometer 81 is located at a position opposite the mirror 82. The laser interferometer 81 measures the position of the substrate stage WS in the X-axis direction by measuring the distance to the mirror 82 in the X-axis direction. Similarly, laser interferometers (not illustrated) for measuring the position of the substrate stage WS in the Y- and Z-axis directions are also disposed. The position of the substrate stage WS is measured by the laser interferometers in real time. The measurements are output to the control unit 1100, and thus, the substrate stage WS is driven to a predetermined position under the control of the control unit 1100. The measurement apparatus 100 may include a scale disposed on the substrate stage WS and an encoder for measuring the position of the substrate stage WS by detecting the position of the scale.

The control unit 1100 controls the components of the measurement apparatus 100 in a centralized manner to operate the measurement apparatus 100. The control unit 1100 performs measurement processing of the measurement apparatus 100 and calculation processing on measurement values obtained by the measurement apparatus 100 as well. The control unit 1100 includes a computer (information processing apparatus). For example, the control unit 1100 includes a processing unit including a processor, such as a central processing unit (CPU), and a storage unit, such as a read-only memory (ROM), a work area of the processing unit, and a random access memory (RAM). The processing unit performs calculation for control based on programs. The ROM stores control programs and fixed data. The RAM stores temporary data. The control unit 1100 may include, as a storage unit, a magnetic storage device (hard disk drive [HDD]) that can store a larger amount of data than the ROM and RAM, a drive unit that reads and writes data from/to an external medium loaded therein, such as a compact disc (CD), a digital versatile disc (DVD), a memory card, other storage devices, or combinations thereof. In the present exemplary embodiment, at least one of a ROM, a RAM, a magnetic storage device, and a drive unit is used as the storage unit, and the storage unit stores control programs, fixed data, and temporary data, and serves as a work area of the processing unit. As used herein, the term "unit" generally refers to software, firmware, hardware, circuitry, other component, or combinations thereof, that is used to effectuate a purpose.

Figure 1B:
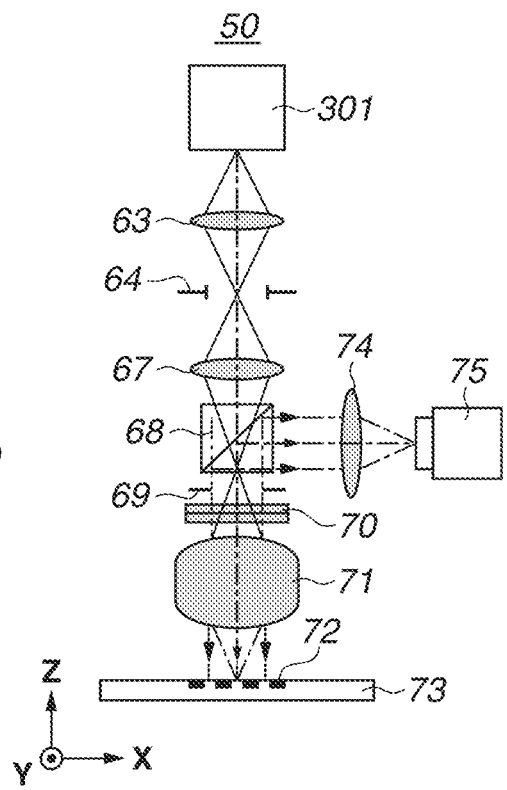

The measurement unit 50 illuminates the pattern(s) disposed on the substrate 73, and detects light from the pattern(s) to capture an image of the pattern(s) disposed on the substrate 73. FIG. 1B is a diagram illustrating a configuration of the measurement unit 50. The measurement unit 50 includes an illumination system for illuminating the substrate 73 with light from an illumination unit (illumination apparatus) 301, and an image forming system (detection system) for focusing light from a pattern 72 (forming an image of the pattern 72) on a detection unit 75. The detection unit 75 includes a light reception unit (not illustrated) for receiving the light from the pattern 72, and obtains a detection signal of the light received by the light reception unit. The detection unit 75 can also function as an imaging unit that forms an imaging area for capturing the image of the pattern 72 using the light reception unit. The pattern 72 is used for measuring an alignment error and/or overlay error of the substrate 73. The position of the pattern 72 is measured based on the detection signal obtained by the detection unit 75.

Figure 1C:
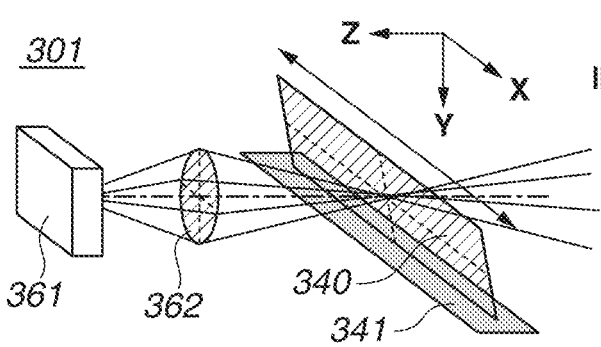

The illumination unit 301 will now be described. FIG. 1C is a diagram illustrating a configuration of the illumination unit 301. The illumination unit 301 includes a light source 361, an illumination optical system (optical system) 362, a wavelength variable unit 340, and a driving unit 341.

Light emitted from the light source 361 is guided to the wavelength variable unit 340 via the illumination optical system 362. Examples of the light source 361 may include such light sources as a laser light source, a light-emitting diode (LED), a halogen lamp, or other light sources.

The illumination optical system 362 irradiates the wavelength variable unit 340 with the light emitted from the light source 361. For example, an axisymmetric transmission optical system including a light-transmitting lens can be used as the illumination optical system 362. Other examples of the illumination optical system 362 may include a reflection optical system including a mirror, such as a concave mirror and a convex mirror, and a cylindrical optical system including a cylindrical lens.

The wavelength variable unit 340 includes a wavelength variable element that changes a relationship (hereinafter, referred to as spectrum) related to the wavelength and intensity of the irradiating light depending on the position or angle of incidence of the light. For example, the spectrum can include information indicating the relationship of the light intensity with the light wavelength. As another example, the spectrum can include information about the light wavelength at which the light intensity has a maximum, minimum, or predetermined value. As another example, the spectrum can include information about the wavelength band of the light where the value of the light intensity falls within a predetermined range. As another example, the spectrum can include information about the waveform of the spectrum. While the wavelength variable unit 340 will be described to include a wavelength variable element of transmission type, a wavelength variable element of reflection type may be included.

The wavelength variable unit 340 is located at a focusing position of the illumination optical system 362 on the optical axis of the illumination optical system 362. The wavelength variable unit 340 is driven (moved) in a direction (in the example of FIG. 1C, X-axis direction) perpendicular to the direction along the optical axis of the illumination optical system 362 (optical axis direction) by the driving unit 341 (moving unit). In the description of the present exemplary embodiment, the wavelength variable unit 340 is described to be driven in the X-axis direction by the driving unit 341. However, the direction of the driving axis (driving direction) of the driving unit 341 is not limited to the X-axis direction. If the beam diameter of the light that is incident on the wavelength variable unit 340 varies depending on the direction, the wavelength variable unit 340 is desirably driven in a direction of minimizing the beam diameter of the light in view of the wavelength characteristic. If, for example, the illumination optical system 362 includes a cylindrical optical system, the wavelength variable unit 340 is desirably driven in the direction of the power of the cylindrical optical system.

The driving unit 341 includes a driving means such as a linear motor, and can drive the wavelength variable unit 340 in a predetermined direction perpendicular to the optical axis. The position of the wavelength variable unit 340 is measured using an encoder or an interferometer, for example. The wavelength variable unit 340 is controlled and driven to a predetermined position by the control unit 1100.

The wavelength variable unit 340 is disposed so that the surface of the wavelength variable unit 340 on which the light is incident (hereinafter, referred to as the incident surface of the wavelength variable unit 340) is tilted by a predetermined tilt angle with respect to a plane perpendicular to the optical axis of the illumination optical system 362. In the example of FIG. 1C, the wavelength variable unit 340 is disposed so that the incident surface of the wavelength variable unit 340 is tilted by the predetermined tilt angle in the direction of rotation about the X-axis perpendicular to the optical axis (ωX-axis direction). In other words, the wavelength variable unit 340 is tilted by the predetermined tilt angle about the driving axis of the driving unit 341. The disposition of the wavelength variable unit 340 will be described below.

The illumination unit 301 can illuminate the substrate 73 with light of a desired wavelength by positioning the wavelength variable unit 340 using the driving unit 341 based on a relationship between the position of the wavelength variable unit 340 in a predetermined direction perpendicular to the optical axis and the wavelength of the light transmitted through the wavelength variable unit 340. As employed herein, the predetermined direction perpendicular to the optical axis refers to a direction perpendicular to the optical axis of the illumination optical system 362, such as the X-axis direction and the Y-axis direction. The relationship between the position and the wavelength will be described below.

The wavelength of the light transmitted through the wavelength variable unit 340 can thus be changed by changing the position of the wavelength variable unit 340 using the driving unit 341. For example, a transmission wavelength variable filter can be used as the wavelength variable unit 340. An example of the transmission wavelength variable filter is a band-pass filter having a multilayer laminate film formed on its light incident surface. The multilayer laminate film is formed to increase in thickness along the direction of change in wavelength. The wavelength of the transmitted light is thus continuously changed by interference of light. As another example, a transmission diffraction grating for separating light into beams of different wavelengths through a diffraction grating formed on a light transmitting member may be used as the wavelength variable unit 340. As another example, a short-wavelength pass filter (low-pass filter or short-pass filter) for transmitting light of shorter wavelengths than a predetermined wavelength can be used as the wavelength variable unit 340. As yet another example, a long-wavelength pass filter (high-pass filter or long-pass filter) for transmitting light of longer wavelengths than a predetermined wavelength can be used as the wavelength variable unit 340.

Returning to FIG. 1B, the light emitted from the illumination unit 301 is incident on an illumination aperture stop 64 via an illumination optical system (first optical system) 63. The illumination aperture stop 64 makes the beam diameter of the light smaller than that at the illumination unit 301. The light passed through the illumination aperture stop 64 is incident on a beam splitter 68 via a relay lens 67. An example of the beam splitter 68 is a polarization beam splitter. The beam splitter 68 allows light that is P-polarized in parallel with the Y-axis direction to pass therethrough, and reflects light that is S-polarized in parallel with the X-axis direction. The light passed through the beam splitter 68 is transmitted through a λ/4-plate 70 via an aperture stop 69, and thereby converted into circularly polarized light. The circularly polarized light illuminates the pattern 72 disposed on the substrate 73 by Köhler illumination via an objective optical system 71.

The illumination optical system 63 may include a light amount adjustment unit (not illustrate) capable of switching a plurality of neutral density (ND) filters having respective different transmittances to the light from the illumination unit 301. The control unit 1100 can precisely adjust the intensity of the light illuminating the substrate 73 by controlling the light amount adjustment unit. The illumination optical system 63 may include a fiber or optical rod for routing the illumination light, or a microlens array for making the illumination light uniform.

The light from the pattern 72 is transmitted through the λ/4-plate 70 via the objective optical system 71 and thereby converted from circularly polarized light into S-polarized light, and incident on the aperture stop 69. The light from the pattern 72 here includes light reflected, diffracted, and scattered by the pattern 72. The light from the pattern 72 is circularly polarized in a reverse direction of rotation to that of the circularly polarized light illuminating the pattern 72. If the light illuminating the pattern 72 is in a clockwise circularly polarized state, the light from the pattern 72 is in a counterclockwise circularly polarized state. The light passed through the aperture stop 69 is reflected by the beam splitter 68 and incident on the detection unit 75 via an imaging optical system 74.

In such a manner, the measurement unit 50 separates the optical path of the light illuminating the substrate 73 and the optical path of the light from the substrate 73 using the beam splitter 68, and forms an image of the pattern 72 on the detection unit 75. The control unit 1100 then obtains the positions of pattern elements constituting the pattern 72 and the position of the pattern 72 based on position information about the substrate stage WS obtained by the laser interferometer 81 and the waveform of the detection signal obtained by detecting the image of the pattern 72.

The measurement unit 50 may include a plurality of lenses between the beam splitter 68 and the detection unit 75 to constitute a detection aperture stop. The illumination aperture stop 64 and the detection aperture stop may each include a plurality of aperture stops that can set different numerical apertures for the illumination system and the detection system, respectively, and the plurality of aperture stops may be configured to be switchable. A σ value, a coefficient indicating the ratio between the numerical aperture of the illumination system and that of the detection system, can thereby be adjusted.

Figure 1D:
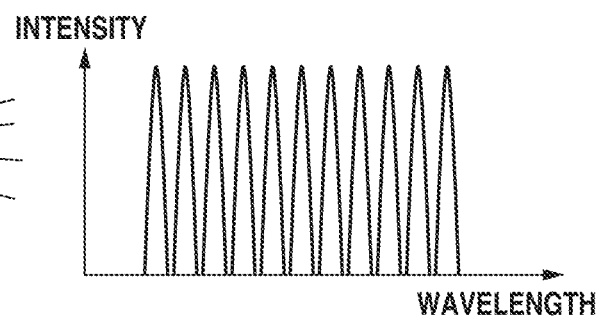

FIG. 1D is a diagram illustrating a relationship between the wavelength and intensity of the light transmitted through the wavelength variable unit 340. FIG. 1D illustrates the relationship between the wavelength and intensity of the light transmitted through the wavelength variable unit 340 in cases where the wavelength variable unit 340 is located at a plurality of discrete positions in the X-axis direction. The incident position of the light varies with the position of the wavelength variable unit 340, and the wavelength of the light transmitted through the wavelength variable unit 340 changes. The absolute position of the light incident on the wavelength variable unit 340 in the measurement unit 50 is unchanged, so that driving the wavelength variable unit 340 by the driving unit 341 changes the relative position of the incident light to the wavelength variable unit 340. In the illumination unit 301 illustrated in FIG. 1C, the driving unit 341 drives the wavelength variable unit 340 in the X-axis direction to change the position of the wavelength variable unit 340 with respect to the incident light, thus adjusting the wavelength of the light illuminating the substrate 73.

Figure 2A:
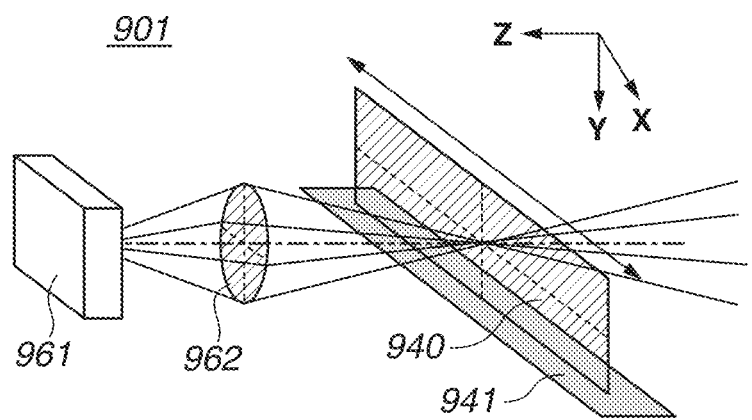
FIGS. 2A and 2B are diagrams illustrating an illumination unit according to a comparative example of the first exemplary embodiment.
Figure 2B:
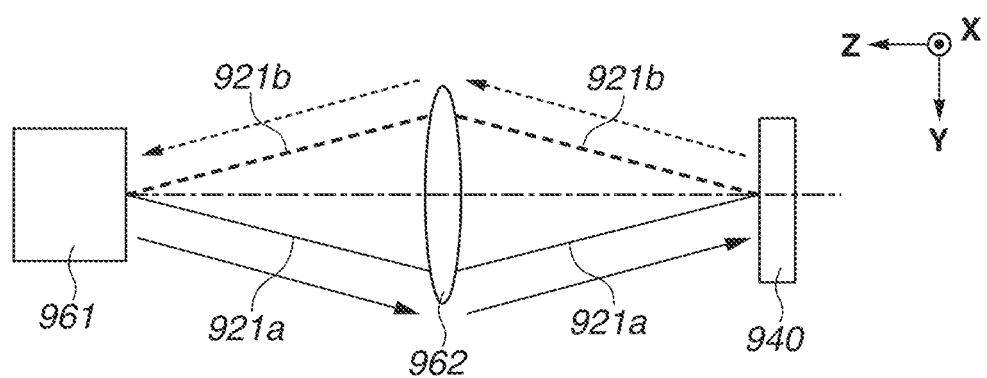

Now, an illumination unit 901 according to a comparative example will be described with reference to FIGS. 2A to 3C. FIGS. 2A and 2B are diagrams illustrating the illumination unit 901 according to the comparative example. The illumination unit 901 includes a light source 961, an illumination optical system 962, a wavelength variable unit 940, and a driving unit 941. The light source 961, the illumination optical system 962, the wavelength variable unit 940, and the driving unit 941 correspond to the light source 361, the illumination optical system 362, the wavelength variable unit 340, and the driving unit 341 illustrated in FIG. 1C, respectively. A detailed description thereof will thus be omitted. A difference from the wavelength variable unit 340 illustrated in FIG. 1C is that the wavelength variable unit 940 is disposed so that the incident surface of the wavelength variable unit 940 is parallel to a plane perpendicular to the optical axis of the illumination optical system 962.

Figure 3A:
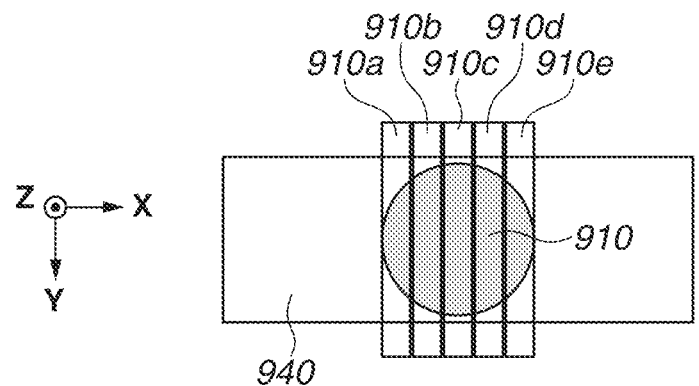
FIGS. 3A to 3C are diagrams illustrating wavelength characteristics related to the illumination unit according to the comparative example of the first exemplary embodiment.
Figure 3B:
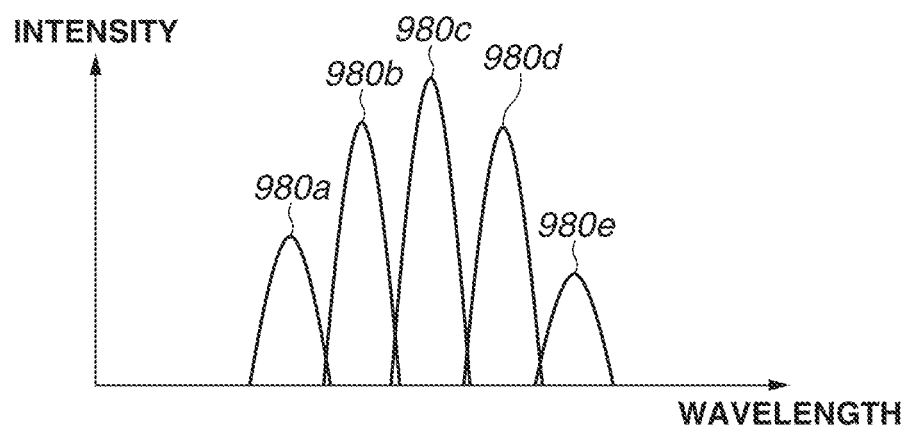
Figure 3C:
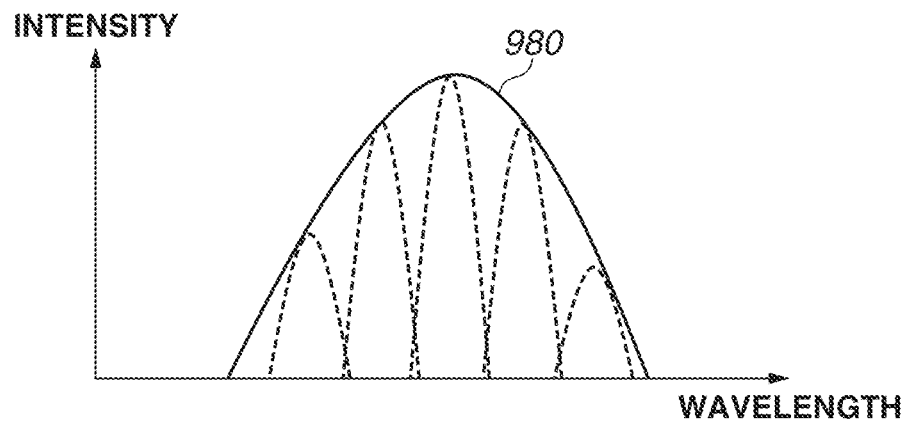

FIGS. 3A to 3C are diagrams illustrating wavelength characteristics related to the illumination unit 901 according to the comparative example of the present exemplary embodiment. The wavelength of light transmitted through the wavelength variable unit 940 changes continuously with the incident position of the light in the X-axis direction.

The wavelength characteristic of the transmitted light thus varies with the beam diameter of the light incident on the wavelength variable unit 940 from the illumination optical system 962. FIG. 3A illustrates that a region including light 910 incident on the wavelength variable unit 940 is divided into regions 910a to 910e. FIGS. 3B and 3C illustrate the wavelength characteristics of the light transmitted through the wavelength variable unit 940. In FIG. 3B, wavelength characteristics 980a to 980e represent the wavelength characteristics of the respective beams incident on the regions 910a to 910e, transmitted through the wavelength variable unit 940. The center wavelength varies with the incident position on the wavelength variable unit 940 in the X-axis direction, so that the wavelength characteristics of the beams transmitted through the regions 910a to 910e vary as indicated by the wavelength characteristics 980a to 980e. The overall wavelength characteristic of the light transmitted through the wavelength variable unit 940 is the sum of the wavelength characteristics 980a to 980e, which is a wavelength characteristic 980 illustrated in FIG. 3C. In other words, the greater the beam diameter of the light 910 incident on the wavelength variable unit 940 in the direction in which the wavelength characteristic of the wavelength variable unit 940 changes (X-axis direction), the wider the range of wavelengths of the light transmitted through the wavelength variable unit 940. This is undesirable because a greater amount of light of wavelengths other than a desired center wavelength can be included in the light transmitted through the wavelength variable unit 940. The wavelength variable unit 940 is thus desirably located at a position at which the beam diameter of the light incident on the wavelength variable unit 940 is smaller. In other words, the wavelength variable unit 940 is desirably located near the position at which the light 910 incident on the wavelength variable unit 940 is focused, more desirably at the position at which the light 910 incident on the wavelength variable unit 940 is focused. In the following description, that a wavelength variable unit is located at a position at which the light incident on the wavelength variable unit is focused covers both the case where the wavelength variable unit is located at the position where the light incident on the wavelength variable unit is focused and the case where the wavelength variable unit is located near the position where the light incident on the wavelength variable unit is focused.

However, if the wavelength variable unit 940 is located at the position at which the light 910 is focused, light reflected by the wavelength variable unit 940 can be focused on the light source 961 by the illumination optical system 962. This can cause degradation in the performance and durability of the light source 961, for example, due to an increase in the temperature of the light source 961. The effect can be particularly pronounced if the light source 961 includes a point light source.

The optical path of the reflected light reflected by the wavelength variable unit 940 will be described with reference to FIG. 2B. Incident light 921a emitted from the light source 961 is incident on the wavelength variable unit 940 via the illumination optical system 962. The wavelength variable unit 940 is disposed in parallel with the plane perpendicular to the optical axis of the illumination optical system 962, so that reflected light 921b from the wavelength variable unit 940 travels through the optical path symmetrical about the optical axis of the illumination optical system 962 and is incident on the light source 961. While the example of FIG. 2B illustrates the incident light 921a and the reflected light 921b, reflected light of incident light traveling through other optical paths is also incident on the light source 961, so that the light reflected by the wavelength variable unit 940 is focused on the light source 961 via the illumination optical system 962. This can degrade the performance and durability of the light source 961.

In view of this, in the illumination unit 301 according to the present exemplary embodiment, the wavelength variable unit 340 is tilted by a predetermined tilt angle in the direction of rotation about the axis (in the example of FIG. 1C, X-axis) perpendicular to the optical axis direction of the illumination optical system 362. In other words, the wavelength variable unit 340 is disposed so that the incident surface of the wavelength variable unit 340 is not parallel with the plane perpendicular to the optical axis of the illumination optical system 362.

This can reduce the incidence of the reflected light from the wavelength variable unit 340 on the light source 361 and prevent degradation in the performance and durability of the light source 361.

Figure 4A:
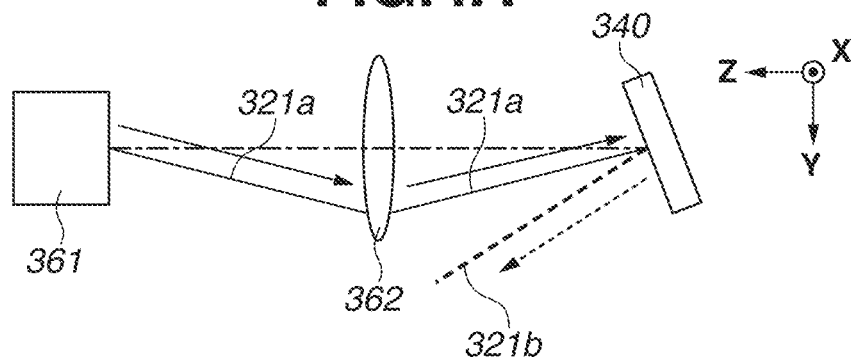
FIGS. 4A to 4D are diagrams illustrating an optical path of an illumination unit according to the first exemplary embodiment and an illumination unit according to a modification.

FIGS. 4A to 4D are diagrams illustrating an optical path of the illumination unit 301 according to the present exemplary embodiment and an illumination unit according to a modification. The optical path of reflected light reflected by the wavelength variable unit 340 according to the present exemplary embodiment will be described with reference to FIG. 4A. Incident light 321a emitted from the light source 361 is incident on the wavelength variable unit 340 via the illumination optical system 362. The incident surface of the wavelength variable unit 340 is tilted by a predetermined tilt angle with respect to the plane perpendicular to the optical axis of the illumination optical system 362, so that the incidence of the reflected light from the wavelength variable unit 340 on the light source 361 via the illumination optical system 362 can be reduced. FIG. 4A illustrates an example where reflected light 321b goes out of the coverage of the illumination optical system 362 and does not return to the light source 361.

Now, the tilt angle at which the incident surface of the wavelength variable unit 340 is tilted with respect to the plane perpendicular to the optical axis of the illumination optical system 362 will be defined as θ. The tilt angle θ can be regarded as the angle formed between the optical axis of the illumination optical system 362 and the perpendicular to the incident surface of the wavelength variable unit 340. The greater the tilt angle θ, the higher the effect of reducing the incidence of the reflected light on the light source 361. However, the wavelength characteristic of the wavelength variable unit 340 can be affected. In view of this, the tilt angle θ may be determined based on an effective radius r of the illumination optical system 362 and a distance d between the illumination optical system 362 and the wavelength variable unit 340 in the direction along the optical axis of the illumination optical system 362. Suppose that the tilt angle when the incident surface of the wavelength variable unit 340 is tilted so that a ray emitted from the light source 361, traveled along the optical axis of the illumination optical system 362, and reflected by the incident surface of the wavelength variable unit 340 passes the boundary of the coverage of the illumination optical system 362 (becomes a marginal ray) is α. The tilt angle α is expressed by the following Eq. (1):

$$\tan(2\alpha) = r/d. \quad (1)$$

For example, if θ>6α, the resulting effect of reducing the light incident on the light source 361 is sufficient but the wavelength characteristic of the wavelength variable unit 340 can be affected. If θ<α, the effect on the wavelength characteristic of the wavelength variable unit 340 is sufficiently reduced but the reduction of the light incident on the light source 361 can be limited. To reduce the light incident on the light source 361 and reduce the effect on the wavelength characteristic of the wavelength variable unit 340 in a compatible manner, the tilt angle θ desirably satisfies α≤θ≤6α, more desirably 2α≤θ≤4α.

Figure 4B:
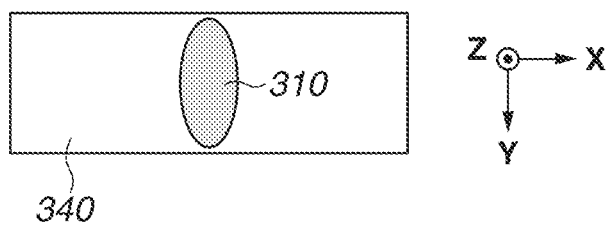

The effect on the wavelength characteristic of the wavelength variable unit 340 can vary depending on the direction in which the incident surface of the wavelength variable unit 340 is tilted. FIG. 4B is a diagram illustrating a beam of light 310 incident on the wavelength variable unit 340. If the incident surface of the wavelength variable unit 340 is tilted about the driving axis (X-axis) of the wavelength variable unit 340 (ωX-axis direction) as illustrated in FIG. 1C, the beam diameter of the light 310 incident on the wavelength variable unit 340 increases in the Y-axis direction but remains unchanged in the X-axis direction. The wavelength of the light transmitted through the wavelength variable unit 340 varies in the X-axis direction that is the driving direction of the wavelength variable unit 340. Tilting the incident surface of the wavelength variable unit 340 about the driving axis of the wavelength variable unit 340 thus reduces the effect on the wavelength characteristic of the wavelength variable unit 340.

Figure 4C:
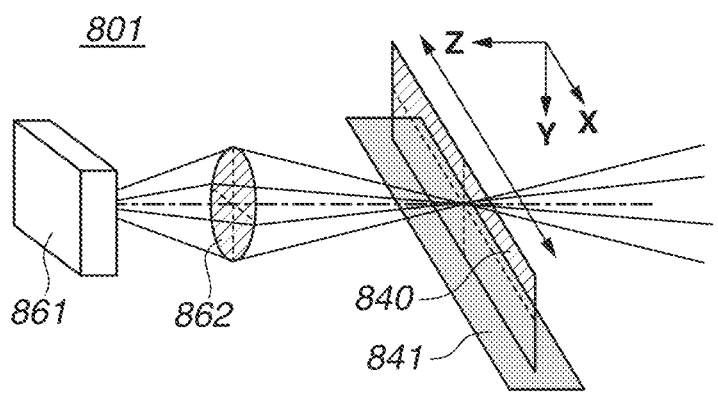

As a modification, an exemplary embodiment where the incident surface of the wavelength variable unit is tilted about an axis perpendicular to the driving axis of the wavelength variable unit (ωY-axis direction) will be described. FIG. 4C is a diagram illustrating an illumination unit 801 according to the modification. The illumination unit 801 includes a light source 861, an illumination optical system 862, a wavelength variable unit 840, and a driving unit 841. The incident surface of the wavelength variable unit 840 is inclined by a predetermined tilt angle in the direction of rotation about the axis (Y-axis) that is perpendicular to the optical axis of the illumination optical system 862 and perpendicular to the driving axis of the wavelength variable unit 840 (ωY-axis direction). In other respects, the configuration of the illumination unit 801 is similar to that of the illumination unit 301 illustrated in FIG. 1C.

Figure 4D:
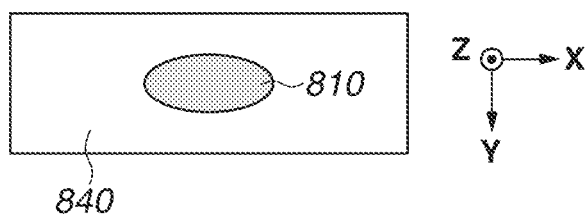

FIG. 4D is a diagram illustrating a beam of light 810 incident on the wavelength variable unit 840. If the incident surface of the wavelength variable unit 840 is tilted about the axis (Y-axis) perpendicular to the driving axis of the wavelength variable unit 840 (ωY-axis direction) as illustrated in FIG. 4C, the beam diameter of the light 810 incident on the wavelength variable unit 840 remains unchanged in the Y-axis direction but increases in the X-axis direction. The wavelength of the light transmitted through the wavelength variable unit 840 varies in the X-axis direction that is the driving direction of the wavelength variable unit 840. With the incident surface of the wavelength variable unit 840 tilted about the axis perpendicular to the driving axis of the wavelength variable unit 840, the wavelength characteristic of the wavelength variable unit 840 thus varies greatly as compared to the case of FIG. 4B. In view of the effect on the wavelength characteristic of the wavelength variable unit, the incident surface of the wavelength variable unit is therefore desirably tilted about the driving axis of the wavelength variable unit.

Moreover, to increase the range of wavelengths of the light to be transmitted, the wavelength variable unit has a shape long in the driving direction. If the incident surface of the wavelength variable unit 840 is tilted about the Y-axis as with the illumination unit 801, the wavelength variable unit 840 occupies more space in the Z-axis direction. Depending on the tilt angle, the wavelength variable unit 840 can interfere with the illumination optical system 862. In other words, the incident surface of the wavelength variable unit is desirably tilted about the driving axis of the wavelength variable unit even in terms of space saving.

In the present exemplary embodiment, the wavelength variable unit 340 has been described to be located at the position at which the incident light is focused. However, the wavelength variable unit 340 may be located away from the position at which the incident light is focused. Alternatively, the light incident on the wavelength variable unit 340 may be collimated light that is incident on the incident surface of the wavelength variable unit 340 in parallel.

In the present exemplary embodiment, the wavelength variable element of the wavelength variable unit 340 has a wavelength characteristic changing in a linear direction. However, this is not restrictive. For example, the wavelength variable unit 340 may employ a method of rotating a disc-shaped wavelength variable element of which the wavelength characteristic changes in a circumferential direction. In such a case, the circumferential direction can be regarded as the driving direction. Alternatively, the wavelength variable unit 340 may have a wavelength characteristic changing linearly depending on the incident position of light, or a wavelength characteristic changing nonlinearly. The wavelength variable unit 340 may include a plurality of wavelength variable units (wavelength variable elements).

As described above, the illumination apparatus according to the present exemplary embodiment includes the wavelength variable unit tilted with respect to the plane perpendicular to the optical axis of the illumination optical system. This prevents the reflected light reflected by the wavelength variable unit from being incident on the light source, thus preventing degradation in the performance and durability of the light source.

Next, an illumination apparatus according to a second exemplary embodiment will be described. What is not mentioned here can be compliant with the first exemplary embodiment. FIGS. 5A to 5C are diagrams illustrating an illumination unit 401 according to the present exemplary embodiment. The illumination unit 401 corresponds to the illumination unit 301 according to the first exemplary embodiment, and differs from the illumination unit 301 in that two wavelength variable units 440a and 440b are included.

FIG. 5A illustrates a configuration of the illumination unit 401 according to the present exemplary embodiment. Light emitted from a light source 461 is guided to the wavelength variable unit 440a via an illumination optical system 462a (optical system).

The light transmitted through the wavelength variable unit 440a is guided to the wavelength variable unit 440b (second wavelength variable unit) via an illumination optical system 462b (second optical system). The wavelength variable units 440a and 440b are driven (moved) in directions perpendicular to the optical axes of the illumination optical systems 462a and 462b (in the example of FIG. 5A, X-axis direction) by driving units 441a and 441b, respectively. Here, the driving directions of the driving units 441a and 441b are the same (X-axis direction). However, this is not restrictive. For example, the driving direction of the driving unit 441a may be the X-axis direction, and the driving direction of the driving unit 441b the Y-axis direction. In other words, the driving directions of the driving units 441a and 441b may be respective different directions perpendicular to the optical axes of the illumination optical systems 462a and 462b.

If a long-wavelength pass filter is used as the wavelength variable unit 440a and a short-wavelength pass filter as the wavelength variable unit 440b, the illumination unit 401 can provide illumination with light having a given center wavelength and a given wavelength width. If a long-wavelength pass filter that allows light of longer wavelengths than a predetermined wavelength to pass therethrough is used as the wavelength variable unit 440a, short-wavelength light incident on the illumination optical system 462b and the wavelength variable unit 440b can be reduced. In particular, if a long-wavelength pass filter that allows light of longer wavelengths than a wavelength range of 10 to 380 nm to pass therethrough is used as the wavelength variable unit 440a, ultraviolet rays can be reduced.

This can reduce degradation in the performance and durability of the illumination optical system 462b and the wavelength variable unit 440b.

The wavelength variable units 440a and 440b are located at the focusing positions of the respective illumination optical systems 462a and 462b. The wavelength variable units 440a and 440b are disposed so that the incident surfaces of the respective wavelength variable units 440a and 440b are tilted in the same direction with respect to the planes perpendicular to the optical axes of the illumination optical systems 462a and 462b. In the example of FIG. 5, the wavelength variable units 440a and 440b are disposed so that the incident surfaces of the wavelength variable units 440a and 440b are tilted by predetermined tilt angles in the directions of rotation about the respective X-axes perpendicular to the optical axis (ωX-axis directions). In other words, the wavelength variable units 440a and 440b are tilted by predetermined tilt angles about the driving axes of the driving units 441a and 441b, respectively.

The tilt angle at which the incident surface of the wavelength variable unit 440a is tilted with respect to a plane perpendicular to the optical axis of the illumination optical system 462a will be defined as $\theta_1$. The tilt angle at which the incident surface (second incident surface) of the wavelength variable unit 440b is tilted with respect to a plane (second plane) perpendicular to the optical axis (second optical axis) of the illumination optical system 462b will be defined as $\theta_2$. The tilt angle $\theta_1$ can be regarded as the angle formed between the optical axis of the illumination optical system 462a and the perpendicular to the incident surface of the wavelength variable unit 440a. The tilt angle $\theta_2$ can be regarded as the angle formed between the optical axis of the illumination optical system 462b and the perpendicular to the incident surface of the wavelength variable unit 440b.

The greater the tilt angles $\theta_1$ and $\theta_2$, the higher the effect of reducing the incidence of the reflected light on the light source 461. However, the wavelength characteristics of the wavelength variable units 440a and 440b can be affected. In view of this, the tilt angle $\theta_1$ can be determined based on an effective radius $r_1$ of the illumination optical system 462a and a distance $d_1$ between the illumination optical system 462a and the wavelength variable unit 440a in the direction along the optical axis of the illumination optical system 462a. The tilt angle $\theta_2$ can be determined based on an effective radius $r_2$ of the illumination optical system 462b and a distance $d_2$ (second distance) between the illumination optical system 462b and the wavelength variable unit 440b in the direction along the optical axis (second optical axis) of the illumination optical system 462b.

Suppose that the tilt angle when the incident surface of the wavelength variable unit 440a is tilted so that a ray emitted from the light source 461, traveled along the optical axis of the illumination optical system 462a, and reflected by the incident surface of the wavelength variable unit 440a passes the boundary of the coverage of the illumination optical system 462a is $\alpha_1$. The tilt angle $\alpha_1$ is expressed by the following Eq. (2):

$$\tan(2\alpha_1)=r_1/d_1. \quad (2)$$

For example, if $\theta_1>6\alpha_1$, the resulting effect of reducing the light incident on the light source 461 is sufficient but the wavelength characteristic of the wavelength variable unit 440a can be affected. If $\theta_1<\alpha_1$, the effect on the wavelength characteristic of the wavelength variable unit 440a is sufficiently reduced but the reduction of the light incident on the light source 461 can be limited. To reduce the light incident on the light source 461 and reduce the effect on the wavelength characteristic of the wavelength variable unit 440a in a compatible manner, the tilt angle $\theta_1$ desirably satisfies $\alpha_1 \le \theta_1 \le 6\alpha_1$, more desirably $2\alpha_1 \le \theta_1 \le 4\alpha_1$.

Similarly, suppose that the tilt angle when the incident surface of the wavelength variable unit 440b is tilted so that a ray emitted from the light source 461 via the wavelength variable unit 440a, traveled along the optical axis of the illumination optical system 462b, and reflected by the incident surface of the wavelength variable unit 440b passes the boundary of the coverage of the illumination optical system 462b is $\alpha_2$. The tilt angle $\alpha_2$ is expressed by the following Eq. (3):

$$\tan(2\alpha_2)=r_2/d_2. \quad (3)$$

For example, if $\theta_2>6\alpha_2$, the resulting effect of reducing the light incident on the light source 461 and the wavelength variable unit 440a is sufficient but the wavelength characteristic of the wavelength variable unit 440b can be affected. If $\theta_2<\alpha_2$, the effect on the wavelength characteristic of the wavelength variable unit 440b is sufficiently reduced but the reduction of the light incident on the light source 461 and the wavelength variable unit 440a can be limited. To reduce the light incident on the light source 461 and the wavelength variable unit 440a and reduce the effect on the wavelength characteristic of the wavelength variable unit 440b in a compatible manner, the tilt angle $\theta_2$ desirably satisfies $\alpha_2 \le \theta_2 \le 6\alpha_2$, more desirably $2\alpha_2 \le \theta_2 \le 4\alpha_2$.

The wavelength variable units 440a and 440b are disposed to have similar wavelength characteristics in the X-axis direction. More specifically, in FIG. 5A, the wavelength variable units 440a and 440b are disposed with the wavelength characteristics of the wavelength variable units 440a and 440b at longer wavelengths in the +X-axis direction and shorter wavelengths in the −X-axis direction.

As illustrated in FIG. 5B, rays emitted from the light source 461 at difference angles and guided to the wavelength variable unit 440a by the illumination optical system 462a will be referred to as rays 421a, 422a, and 423a. The rays 421a, 422a, and 423a transmitted through the wavelength variable unit 440a and guided to the wavelength variable unit 440b via the illumination optical system 462b will be referred to as rays 421b, 422b, and 423b, respectively. As illustrated in FIG. 5C, light 410a incident on the wavelength variable unit 440a includes a ray 411a that is guided to a shorter-wavelength position of the wavelength variable unit 440a, a ray 413a that is guided to a longer-wavelength position, and a ray 412a that is guided to a position of intermediate wavelength characteristic. Light 410b that is incident on the wavelength variable unit 440b includes a ray 411b that is guided to a longer-wavelength position of the wavelength variable unit 440b, a ray 413b that is guided to a shorter-wavelength position, and a ray 412b that is guided to a position of intermediate wavelength characteristic.

Modifications of the present exemplary embodiment will now be described. FIGS. 6A to 6C are diagrams illustrating an illumination unit 701 according to a first modification of the present exemplary embodiment. As illustrated in FIGS. 6A to 6C, wavelength variable units 740a and 740b are tilted in opposite ωX-axis directions. As compared to the illumination unit 401 illustrated in FIGS. 5A to 5C, the wavelength variable unit 740a is tilted in the same ωX-axis direction as is the wavelength variable unit 440a. As compared to the illumination unit 401, the wavelength variable unit 740b is tilted in an ωX-axis direction opposite to the wavelength variable unit 440b.

FIGS. 7A to 7C are diagrams for describing an illumination unit 601 according to a second modification of the present exemplary embodiment. As illustrated in FIGS. 7A to 7C, the wavelength variable units 640a and 640b are disposed so that the wavelength variable units 640a and 640b have wavelength characteristics reverse in the X-axis direction. More specifically, the wavelength variable unit 640a is disposed with the wavelength characteristic at longer wavelengths in the +X-axis direction and shorter wavelengths in the −X-axis direction. By contrast, the wavelength variable unit 640b is disposed with the wavelength characteristic at shorter wavelengths in the +X-axis direction and longer wavelengths in the −X-axis direction. As compared to the illumination unit 401 illustrated in FIGS. 5A to 5C, the wavelength variable unit 640a is disposed to have a wavelength characteristic similar to that of the wavelength variable unit 440a in the X-axis direction. As compared to the illumination unit 401, the wavelength variable unit 640b is disposed to have a wavelength characteristic reverse to that of the wavelength variable unit 440b in the X-axis direction.

Figure 8A:
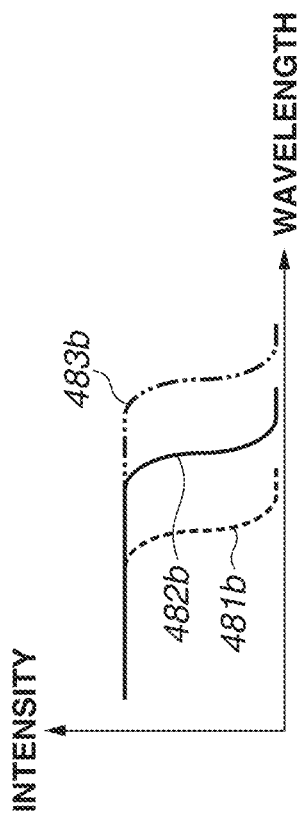
FIGS. 8A to 8D are diagrams illustrating wavelength characteristics related to the illumination unit according to the second exemplary embodiment.
Figure 8B:
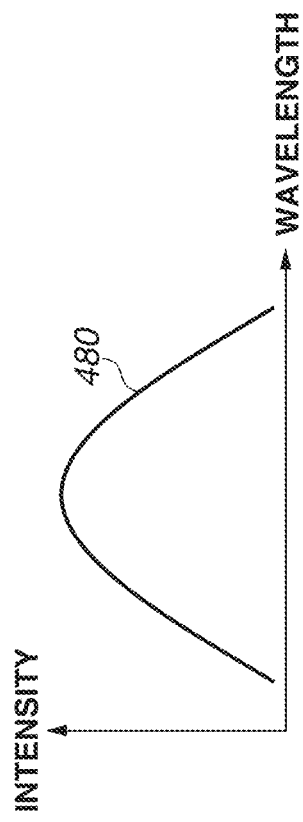
Figure 8C:
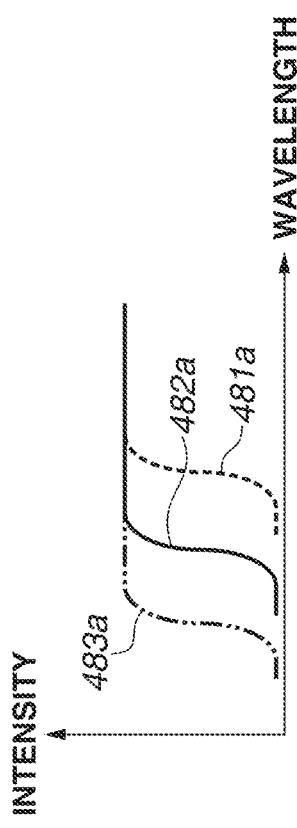

Next, a difference between the case where the illumination unit 401 is used and the case where the illumination unit 701 is used will be described with reference to FIGS. 8A to 9D. FIGS. 8A to 8D are diagrams illustrating wavelength characteristics related to the illumination unit 401. FIG. 8A illustrates the wavelength characteristic of the light transmitted through the wavelength variable unit 440a. FIG. 8B illustrates the wavelength characteristic of the light transmitted through the wavelength variable unit 440b. FIG. 8C illustrates the wavelength characteristic of the light transmitted through the wavelength variable units 440a and 440b. In FIG. 8A, wavelength characteristics 481a, 482a, and 483a are the wavelength characteristics of the rays 421a, 422a, and 423a illustrated in FIG. 5B, respectively, transmitted through the wavelength variable unit 440a. In FIG. 8B, wavelength characteristics 481b, 482b, and 483b are the wavelength characteristics of the rays 421b, 422b, and 423b illustrated in FIG. 5B, respectively, transmitted through the wavelength variable unit 440b.

In general, the greater the angle of light incident on a wavelength variable element, the shorter wavelengths the graph of the wavelength characteristic shifts toward. In FIG. 5B, the ray 423a is incident on the wavelength variable unit 440a at a greater angle than is the ray 421a. In FIG. 8A, the graph of the wavelength characteristic 483a thus shifts toward shorter wavelengths than in the graph of the wavelength characteristic 481a. For the same reason, in FIG. 8B, the graph of the wavelength characteristic 481b shifts toward shorter wavelengths than in the graph of the wavelength characteristic 483b. In FIG. 8C, wavelength characteristics 481, 482, and 483 are the product of the wavelength characteristics 481a and 481b, the product of the wavelength characteristics 482a and 482b, and the product of the wavelength characteristics 483a and 483b, respectively. The wavelength characteristic of the illuminating light from the illumination unit 401 becomes the sum of the wavelength characteristics 481, 482, and 483, which is a wavelength characteristic 480 illustrated in FIG. 8D.

Figure 9A:
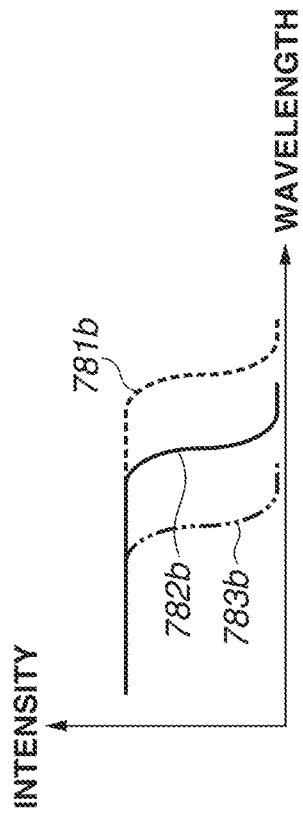
FIGS. 9A to 9D are diagrams illustrating wavelength characteristics related to the illumination unit according to the first modification of the second exemplary embodiment.
Figure 9B:
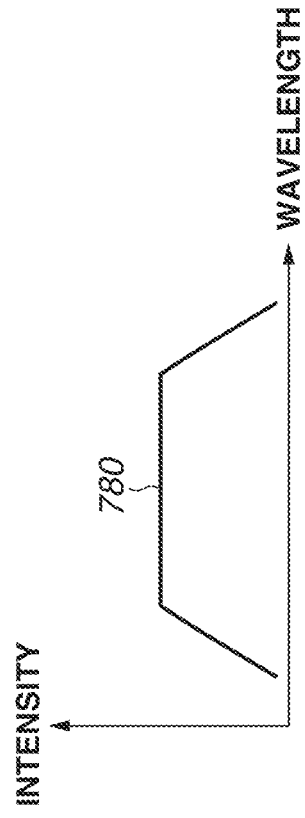
Figure 9C:
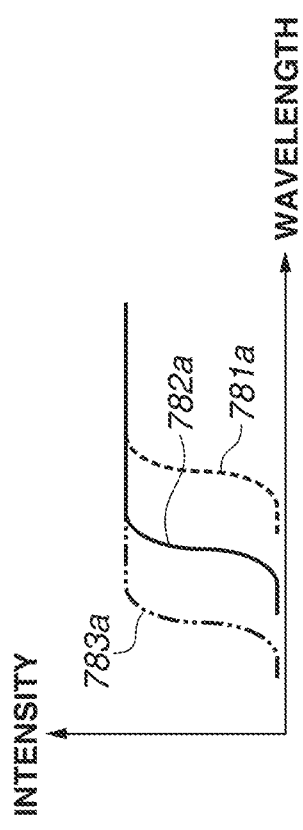

FIGS. 9A to 9D are diagrams illustrating wavelength characteristics related to the illumination unit 701. FIG. 9A illustrates the wavelength characteristic of the light transmitted through the wavelength variable unit 740a. FIG. 9B illustrates the wavelength characteristic of the light transmitted through the wavelength variable unit 740b. FIG. 9C illustrates the wavelength characteristic of the light transmitted through the wavelength variable units 740a and 740b. In FIG. 9A, wavelength characteristics 781a, 782a, and 783a are the wavelength characteristics of the rays 721a, 722a, and 723a illustrated in FIG. 6B, respectively, transmitted through the wavelength variable unit 740a. In FIG. 9B, wavelength characteristics 781b, 782b, and 783b are the wavelength characteristics of the rays 721b, 722b, and 723b illustrated in FIG. 6B, respectively, transmitted through the wavelength variable unit 740b.

Figure 8D:
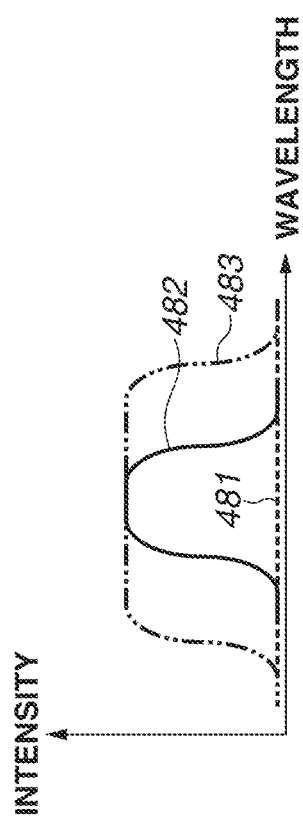
Figure 9D:
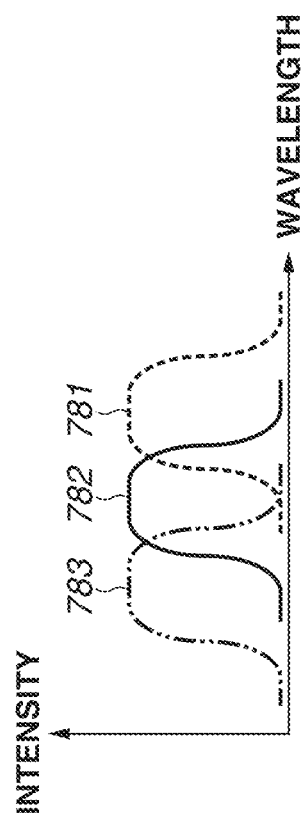

The wavelength variable unit 740b is tilted in a reverse direction to that of the wavelength variable unit 440b. In the illumination unit 701, the graph of the wavelength characteristic 783b in FIG. 9B thus shifts toward shorter wavelengths. Wavelength characteristics 781, 782, and 783 in FIG. 9C are therefore different from the wavelength characteristics 481, 482, and 483 in FIG. 8C. The wavelength characteristics 781, 782, and 783 have a constant wavelength width and vary in the center wavelength, whereas the wavelength characteristics 481, 482, and 483 have a constant center wavelength and vary in the wavelength width. This makes the wavelength characteristics 781, 782, and 783 smaller in the amount of light near the center than the wavelength characteristics 481, 482, and 483. FIG. 9D illustrates the resulting wavelength characteristic 780 of the illuminating light from the illumination unit 701. It can be seen that the wavelength characteristic 480 illustrated in FIG. 8D is steeper than the wavelength characteristic 780 illustrated in FIG. 9D. The illuminating light from the illumination unit 401 is therefore more advantageous in terms of the wavelength characteristic of light than the illuminating light from the illumination unit 701.

Since the wavelength variable units 440a and 440b are tilted, the optical path length of the light transmitted through the wavelength variable units 440a and 440b varies with the thicknesses and the tilt angles of the wavelength variable units 440a and 440b. In the illumination unit 401, the wavelength variable units 440a and 440b are tilted in directions in which a difference between the optical path lengths of the rays 421b and 423b due to the tilt of the wavelength variable units 440a and 440b decreases. By contrast, in the illumination unit 701, the wavelength variable units 740a and 740b are tilted in directions in which a difference between the optical path lengths of the rays 721b and 723b due to the tilt of the wavelength variable units 740a and 740b increases. This shows that the illumination unit 401 can reduce the difference between the optical path lengths of the rays 421b and 423b as compared to the difference between the optical path lengths of the rays 721b and 723b. The illuminating light from the illumination unit 401 is thus more advantageous in terms of the quality of light than the illuminating light from the illumination unit 701. The wavelength variable units 440a and 440b are desirably disposed to make the optical path lengths of the rays 421b and 423b the same. However, this is not restrictive. The wavelength variable units 440a and 440b may be tilted at different tilt angles. The wavelength variable units 440a and 440b may be tilted in a reverse ωX-axis direction.

Figure 10A:
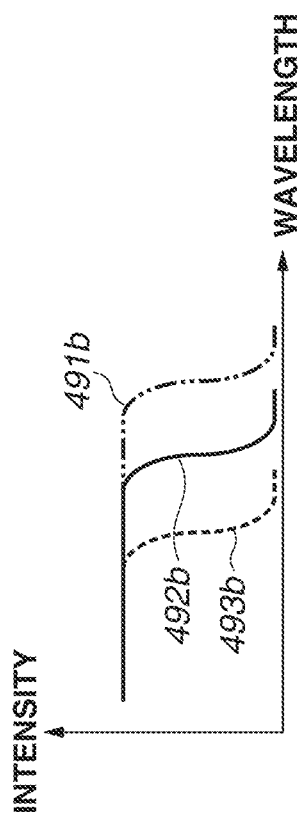
FIGS. 10A to 10D are diagrams illustrating the wavelength characteristics related to the illumination unit according to the second exemplary embodiment.
Figure 10B:
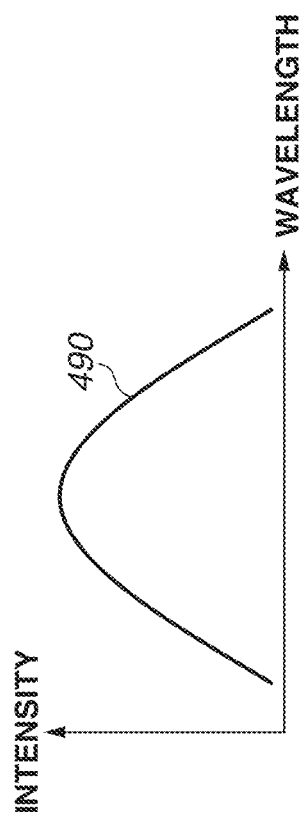
Figure 10C:
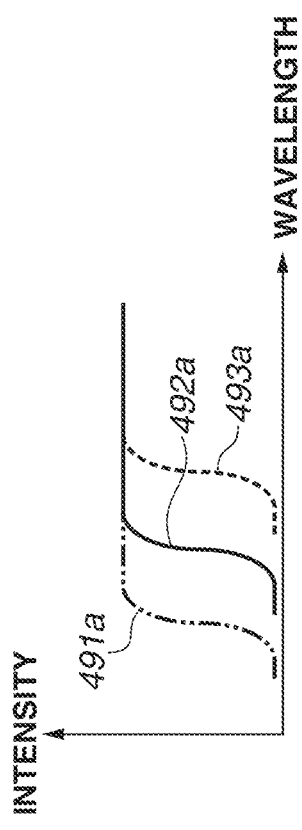

Next, a difference between the case where the illumination unit 401 is used and the case where the illumination unit 601 is used will be described with reference to FIGS. 10A to 11D. FIGS. 10A to 10D are diagrams illustrating wavelength characteristics related to the illumination unit 401. FIG. 10A illustrates the wavelength characteristic of the light transmitted through the wavelength variable unit 440a. FIG. 10B illustrates the wavelength characteristic of the light transmitted through the wavelength variable unit 440b. FIG. 10C illustrates the wavelength characteristic of the light transmitted through the wavelength variable units 440a and 440b. In FIG. 10A, wavelength characteristics 491a, 492a, and 493a are the wavelength characteristics of the rays 411a, 412a, and 413a illustrated in FIG. 5C, respectively, transmitted through the wavelength variable unit 440a. In FIG. 10B, wavelength characteristics 491b, 492b, and 493b are the wavelength characteristics of the rays 411b, 412b, and 413b illustrated in FIG. 5C, respectively, transmitted through the wavelength variable unit 440b. In FIG. 10C, wavelength characteristics 491, 492, and 493 are the product of the wavelength characteristics 491a and 491b, the product of the wavelength characteristics 492a and 492b, and the product of the wavelength characteristics 493a and 493b, respectively. The wavelength characteristic of the illuminating light from the illumination unit 401 becomes the sum of the wavelength characteristics 491, 492, and 493, which is a wavelength characteristic 490 illustrated in FIG. 10D.

Figure 11A:
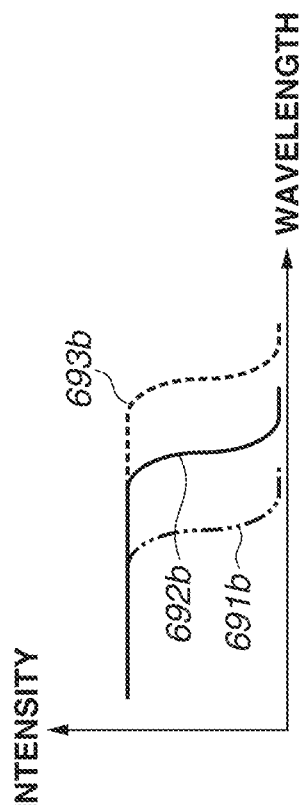
FIGS. 11A to 11D are diagrams illustrating wavelength characteristics related to the illumination unit according to the second modification of the second exemplary embodiment.
Figure 11B:
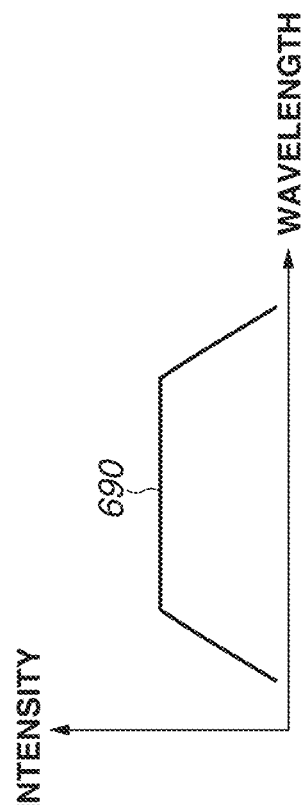
Figure 11C:
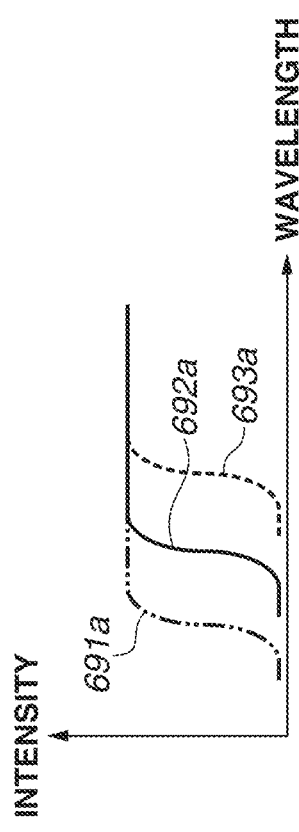

FIGS. 11A to 11D are diagrams illustrating wavelength characteristics related to the illumination unit 601. FIG. 11A illustrates the wavelength characteristic of the light transmitted through the wavelength variable unit 640a. FIG. 11B illustrates the wavelength characteristic of the light transmitted through the wavelength variable unit 640b. FIG. 11C illustrates the wavelength characteristic of the light transmitted through the wavelength variable units 640a and 640b. In FIG. 11A, wavelength characteristics 691a, 692a, and 693a are the wavelength characteristics of rays 611a, 612a, and 613a illustrated in FIG. 7C, respectively, transmitted through the wavelength variable unit 640a. In FIG. 11B, wavelength characteristics 691b, 692b, and 693b are the wavelength characteristics of rays 611b, 612b, and 613b illustrated in FIG. 7C, respectively, transmitted through the wavelength variable unit 640b.

Figure 10D:
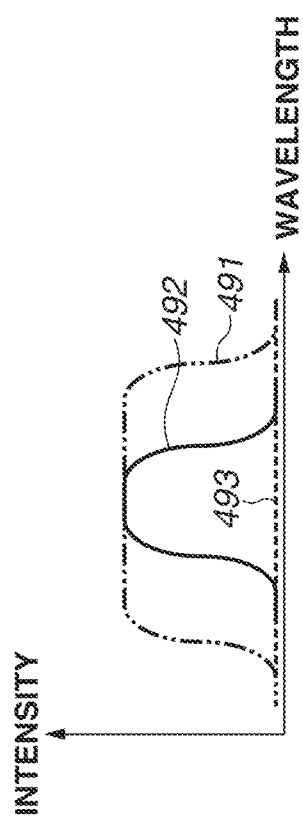
Figure 11D:
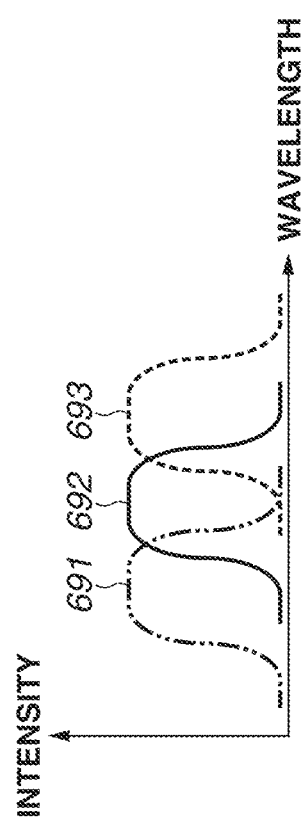

As compared to the wavelength variable unit 440b, the wavelength variable unit 640b is disposed so that the wavelength characteristic is reverse in the X-axis direction. In FIG. 11B, the wavelength characteristic 693b thus represents the characteristic at longer wavelengths, and the wavelength characteristic 691b at shorter wavelengths. Wavelength characteristics 691, 692, and 693 in FIG. 11C are therefore different from the wavelength characteristics 491, 492, and 493 in FIG. 10C. The wavelength characteristics 691, 692, and 693 have a constant wavelength width and vary in the center wavelength, whereas the wavelength characteristics 491, 492, and 493 have a constant center wavelength and vary in the wavelength width. This makes the wavelength characteristics 691, 692, and 693 smaller in the amount of light near the center than the wavelength characteristics 491, 492, and 493. FIG. 11D illustrates the resulting wavelength characteristic 690 of the illuminating light from the illumination unit 601. It can be seen that the wavelength characteristic 490 illustrated in FIG. 10D is steeper than the wavelength characteristic 690 illustrated in FIG. 11D. The illuminating light from the illumination unit 401 is therefore more advantageous in terms of the wavelength characteristic of light than the illuminating light from the illumination unit 601.

In FIG. 5C, the wavelength variable unit 440b is described to be disposed so that the ray 411b is guided to a longer-wavelength position of the wavelength variable unit 440b and the ray 413b to a shorter-wavelength position. However, this is not restrictive. For example, the wavelength variable unit 440b may be disposed so that the ray 411b is guided to a shorter-wavelength position of the wavelength variable unit 440b and the ray 413b to a longer-wavelength position. The illumination optical system 462b may include an optical rod or fiber so that a mixture of the rays 411b, 412b, and 413b is guided to the wavelength variable unit 440b.

While a long-wavelength pass filter is described to be used as the wavelength variable unit 440a and a short-wavelength pass filter as the wavelength variable unit 440b, this is not restrictive. A short-wavelength pass filter may be used as the wavelength variable unit 440a, and a long-wavelength pass filter as the wavelength variable unit 440b. At least either one of the wavelength variable units 440a and 440b may be a band-pass filter. The wavelength variable units 440a and 440b each may include a plurality of wavelength variable units (wavelength variable elements).

As described above, the illumination apparatus according to the present exemplary embodiment includes the wavelength variable units tilted with respect to the planes perpendicular to the optical axes of the illumination optical systems. This prevents the reflected light reflected at the wavelength variable units from being incident on the light source, so that degradation in the performance and durability of the light source can be prevented. The inclusion of the plurality of wavelength variable units can also reduce degradation in the performance and durability of not only the light source but also the illumination optical systems and the wavelength variable units.

Next, an illumination apparatus according to a third exemplary embodiment will be described. What is not mentioned here can be compliant with the first and second exemplary embodiments. An illumination unit 501 according to the present exemplary embodiment corresponds to the illumination unit 301 according to the first exemplary embodiment and the illumination unit 401 according to the second exemplary embodiment. The illumination unit 501 is different from the illumination unit 301 in that two wavelength variable units 540a and 540b are included. The illumination unit 501 is different from the illumination unit 401 in that an illumination optical system 562 located between a light source 561 and the wavelength variable unit 540a has a characteristic of focusing illuminating light on two different positions. The illumination unit 501 is also different from the illumination unit 401 in that no illumination optical system is disposed between the wavelength variable units 540a and 540b.

Figure 12:
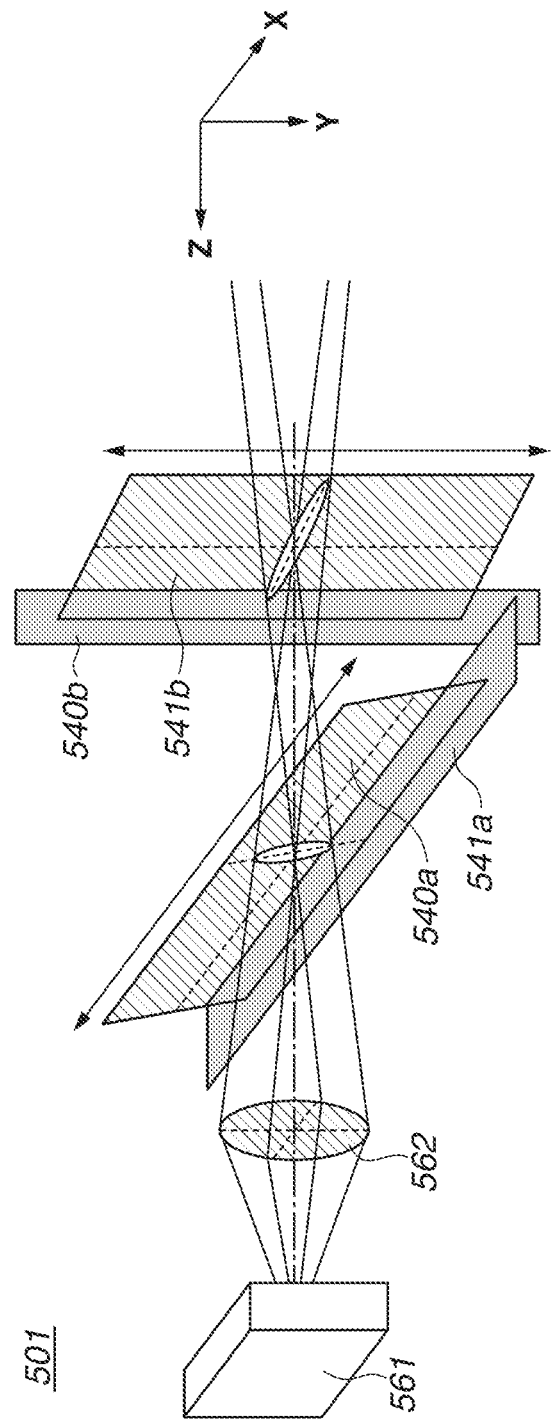
FIG. 12 is a diagram illustrating an illumination unit according to a third exemplary embodiment.

FIG. 12 is a diagram illustrating the illumination unit 501 according to the present exemplary embodiment. The illumination unit 501 includes the light source 561, the illumination optical system 562, the wavelength variable units 540a and 540b, and driving units 541a and 541b.

Light emitted from the light source 561 is guided to the wavelength variable unit 540a (first wavelength variable unit) via the illumination optical system 562 (optical system). The light emitted from the wavelength variable unit 540a is guided to the wavelength variable unit 540b (second wavelength variable unit). The illumination optical system 562 includes a cylindrical optical system including a cylindrical lens, for example, and has the characteristic of focusing the emitted light on two different positions. As illustrated in FIG. 12, the light emitted from the illumination optical system 562 is focused so that rays on an XZ plane are focused on a first focusing position, and rays on a YZ plane are focused on a second focusing position. In other words, the light emitted from the illumination optical system 562 is focused along the Y-axis direction on the first focusing position and focused along the X-axis direction on the second focusing position.

The wavelength variable unit 540a is located at the first focusing position. The wavelength variable unit 540b is located at the second focusing position.

The driving unit 541a (first moving unit) and the driving unit 541b (second moving unit) respectively drive the wavelength variable units 540a and 540b in two mutually different directions perpendicular to the optical axis direction of the illumination optical system 562. The driving unit 541a drives the wavelength variable unit 540a in the X-axis direction (first-axis direction). The driving unit 541b drives the wavelength variable unit 540b in the Y-axis direction (second-axis direction). In other words, the wavelength variable units 540a and 540b are driven in the light-focusing directions at the first and second focusing positions, respectively. More specifically, the driving unit 541a drives the wavelength variable unit 540a in the direction in which the beam diameter of the light from the illumination optical system 562 is minimized at the incident surface of the wavelength variable unit 540a. The driving unit 541b drives the wavelength variable unit 540b in the direction in which the beam diameter of the light from the wavelength variable unit 540a is minimized at the incident surface of the wavelength variable unit 540b. The width of the beam with which the wavelength variable units 540a and 540b are irradiated can thereby be reduced in the wavelength-changing directions of the wavelength variable units 540a and 540b, which is advantageous in terms of wavelength characteristic.

The wavelength variable units 540a and 540b are disposed so that the incident surfaces of the respective wavelength variable units 540a and 540b are tilted with respect to a plane perpendicular to the optical axis of the illumination optical system 562. In the example of FIG. 12, the wavelength variable unit 540a is disposed so that the incident surface (first incident surface) of the wavelength variable unit 540a is tilted by a predetermined tilt angle in the direction of rotation about the X-axis perpendicular to the optical axis ($\omega$X-axis direction). The wavelength variable unit 540b is disposed so that the incident surface (second incident surface) of the wavelength variable unit 540b is tilted by a predetermined tilt angle in the direction of rotation about the Y-axis perpendicular to the optical axis ($\omega$Y-axis direction). In other words, the wavelength variable units 540a and 540b are tilted by predetermined tilt angles about the driving axes of the driving units 541a and 541b, respectively.

The tilt angles by which the incident surfaces of the wavelength variable units 540a and 540b are tilted will be defined as $\theta_3$ and $\theta_4$, respectively. The tilt angles $\theta_3$ and $\theta_4$ can be regarded as the angles formed between the optical axis of the illumination optical system 562 and the perpendiculars to the incident surfaces of the wavelength variable units 540a and 540b, respectively. The greater the tilt angles $\theta_3$ and $\theta_4$, the higher the effect of reducing the incidence of the reflected light on the light source 561. However, the wavelength characteristics of the wavelength variable units 540a and 540b can be affected. In view of this, the tilt angle $\theta_3$ can be determined based on an effective radius $r_3$ of the illumination optical system 562 and a distance $d_3$ between the illumination optical system 562 and the wavelength variable unit 540a in the direction along the optical axis of the illumination optical system 562a. The tilt angle $\theta_4$ can be determined based on the effective radius $r_3$ of the illumination optical system 562 and a distance $d_4$ between the illumination optical system 562 and the wavelength variable unit 540b in the direction along the optical axis of the illumination optical system 562.

Suppose that the tilt angle when the incident surface of the wavelength variable unit 540a is tilted so that a ray emitted from the light source 561, traveled along the optical axis of the illumination optical system 562, and reflected by the incident surface of the wavelength variable unit 540a passes the boundary of the coverage of the illumination optical system 562 is $\alpha_3$. The tilt angle as is expressed by the following Eq. (4):

$$\tan(2\alpha_3) = r_3/d_3. \quad (4)$$

For example, if $\theta_3 > 6\alpha_3$, the resulting effect of reducing the light incident on the light source 561 is sufficient but the wavelength characteristic of the wavelength variable unit 540a can be affected. If $\theta_3 < \alpha_3$, the effect on the wavelength characteristic of the wavelength variable unit 540a is sufficiently reduced but the reduction of the light incident on the light source 561 can be limited. To reduce the light incident on the light source 561 and reduce the effect on the wavelength characteristic of the wavelength variable unit 540a in a compatible manner, the tilt angle $\theta_3$ desirably satisfies $\alpha_3 \leq \theta_3 \leq 6\alpha_3$, more desirably $2\alpha 3 \leq \theta_3 \leq 4\alpha_3$.

Similarly, suppose that the tilt angle when the incident surface of the wavelength variable unit 540b is tilted so that a ray emitted from the light source 561 via the wavelength variable unit 540a, traveled along the optical axis of the illumination optical system 562, and reflected by the incident surface of the wavelength variable unit 540b passes the boundary of the coverage of the illumination optical system 562 is $\alpha_4$. The tilt angle $\alpha_4$ is expressed by the following Eq. (5):

$$\tan(2\alpha_4) = r_3/d_4. \quad (5)$$

For example, if $\theta_4 > 6\alpha_4$, the resulting effect of reducing the light incident on the light source 561 and the wavelength variable unit 540a is sufficient but the wavelength characteristic of the wavelength variable unit 540b can be affected. If $\theta_4 < \alpha_4$, the effect on the wavelength characteristic of the wavelength variable unit 540b is sufficiently reduced but the reduction of the light incident on the light source 561 and the wavelength variable unit 540a can be limited. To reduce the light incident on the light source 561 and the wavelength variable unit 540a and reduce the effect on the wavelength characteristic of the wavelength variable unit 540b in a compatible manner, the tilt angle $\theta_4$ desirably satisfies $\alpha_4 \leq \theta_4 \leq 6\alpha_4$, more desirably $2\alpha 4 \leq \theta_4 \leq 3\alpha_4$.

In the present exemplary embodiment, the illumination optical system 562 is described to include a cylindrical optical system including a cylindrical lens. However, this is not restrictive. The illumination optical system 562 may include other optical systems that have the characteristic of focusing emitted light on two different positions.

In the present exemplary embodiment, the wavelength variable unit 540a is located at the first focusing position at which the light from the illumination optical system 562 is focused on the XZ plane. The wavelength variable unit 540b is located at the second focusing position at which the light from the illumination optical system 562 is focused on the YZ plane. However, this is not restrictive. The wavelength variable units 540a and 540b may be located at positions away from the first and second focusing positions, respectively.

As described above, the illumination apparatus according to the present exemplary embodiment includes the wavelength variable units tilted with respect to the plane perpendicular to the optical axis of the illumination optical system. This prevents the reflected light reflected at the wavelength variable units from being incident on the light source, so that degradation in the performance and durability of the light source can be prevented. The inclusion of the plurality of wavelength variable units can also reduce degradation in the performance and durability of not only the light source but also the illumination optical system and the wavelength variable units. Moreover, such a configuration is advantageous in terms of space saving since no illumination operation system needs to be disposed between the plurality of wavelength variable units.

Figure 13:
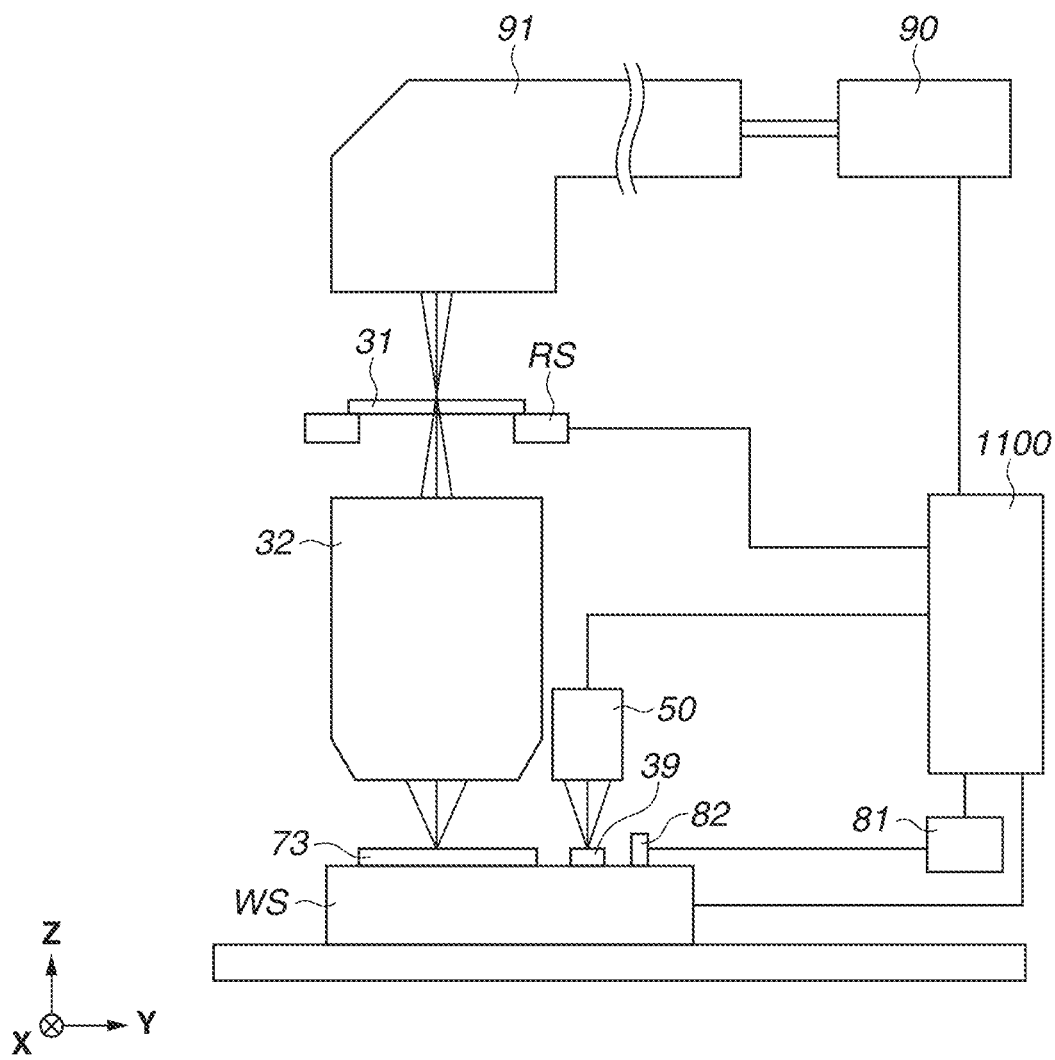
FIG. 13 is a diagram illustrating an exposure apparatus according to a fourth exemplary embodiment.

A fourth exemplary embodiment will be described below. The fourth exemplary embodiment deals with a mode where an exposure apparatus serving as a substrate processing apparatus includes a measurement apparatus (measurement unit). What is not mentioned here can be compliant with the first to third exemplary embodiments. The exposure apparatus according to the present exemplary embodiment will be described with reference to FIG. 13. An exposure apparatus EXA is a lithographic apparatus for use in a lithographic process that is a process for manufacturing a device such as a semiconductor element and a liquid crystal element, and forms a pattern on a substrate 73. The exposure apparatus EXA performs exposure processing (substrate processing) for exposing the substrate 73 (wafer) via a reticle (master or mask) 31 to transfer the pattern of the reticle 31 to the substrate 73.

The reticle 31 is a reticle, master, or mask where a predetermined pattern, such as a circuit pattern, is formed. The reticle 31 is made of quartz, for example. The reticle 31 allows illuminating light from an illumination optical system 91 to pass therethrough (described below). The substrate 73 is an object to be processed to which the pattern of the reticle 31 is transferred. Examples of the substrate 73 include a silicon wafer, a glass plate, a film-shaped substrate, and other substrates to be processed. The pattern is transferred to the substrate 73 by exposure of the substrate 73 with a photoresist applied thereto to light.

The exposure apparatus EXA will be described by using an example where a scanning exposure apparatus (scanner) is used that exposes the substrate 73 to the pattern formed on the reticle 31 while moving the reticle 31 and the substrate 73 in a scanning direction in synchronization with each other. The present exemplary embodiment is also applicable to a type of exposure apparatus (stepper) that exposes the substrate 73 to the reticle pattern with the reticle 31 fixed.

The exposure apparatus EXA includes a light source unit 90, the illumination optical system 91, a reticle stage RS, a projection optical system 32, a substrate stage WS, a measurement unit 50, and a control unit 1100.

The light source unit 90 includes at least one of the following light sources: a mercury lamp, a KrF excimer laser, and an ArF excimer laser. An extreme ultraviolet (EUV) light source of several to a hundred nanometers in wavelength may be included.

The illumination optical system 91 shapes the light emitted from the light source unit 90 into a slit beam having a predetermined shape optimum for exposure, and irradiates the reticle 31 held on the reticle stage RS with the slit beam, so that a predetermined illumination region on the reticle 31 is illuminated. The illumination optical system 91 illuminates the predetermined illumination region on the reticle 31 with light of uniform luminance distribution. For example, the illumination optical system 91 includes a lens, a mirror, an optical integrator, and a diaphragm. For example, the illumination optical system 91 is constituted by arranging a condenser lens, a fly-eye lens, an aperture stop, a condenser lens, a slit, and an imaging optical system in this order.

The reticle stage RS moves with the reticle 31 held thereon. For example, the reticle stage RS can move within a plane perpendicular to the optical axis of the projection optical system 32, i.e., an XY plane and rotate in an ωZ-axis direction (direction of rotation about a Z-axis). The reticle stage RS is driven by a driving apparatus (not illustrated), such as a linear motor. The driving apparatus is capable of driving in three axial directions, namely, X-axis, Y-axis, and an ωZ-axis directions, and is controlled by the control unit 1100 to be described below. While the driving apparatus is described to be capable of driving in three axial directions, the driving apparatus may be capable of driving in any number of axial directions from one to six.

The projection optical system 32 irradiates the substrate 73 held on the substrate stage WS with the light transmitted through the reticle 31, so that the image of the pattern formed on the reticle 31 is projected upon the substrate 73 with a predetermined projection magnification β. The substrate 73 is thus exposed to the light emitted from the projection optical system 32, thus forming the pattern. The projection optical system 32 includes a plurality of optical elements. The predetermined projection magnification β is ¼ or ⅕, for example.

A description of components of the substrate stage WS common with the first exemplary embodiment will be omitted.

The substrate stage WS includes a reference plate 39 bearing a reference mark. The height of the surface of the reference plate 39 is defined to be the same as that of the surface of the substrate 73 held on the substrate stage WS. The measurement unit 50 measures the position of the reference mark on the reference plate 39 as well as the position of a pattern disposed on the substrate 73.

The control unit 1100 controls the components of the exposure apparatus EXA, including a measurement apparatus 100 (see FIG. 1A), in a centralized manner.

The control unit 1100 has a configuration similar to that in the first exemplary embodiment. A description thereof will thus be omitted.

The measurement unit 50 is similar to that in the first exemplary embodiment. A description thereof will thus be omitted. While the present exemplary embodiment deals with a mode where the measurement apparatus 100 including the illumination unit 301 according to the first exemplary embodiment is used, a measurement apparatus including the illumination unit described in either the second or third exemplary embodiment may be used.

Figure 14:
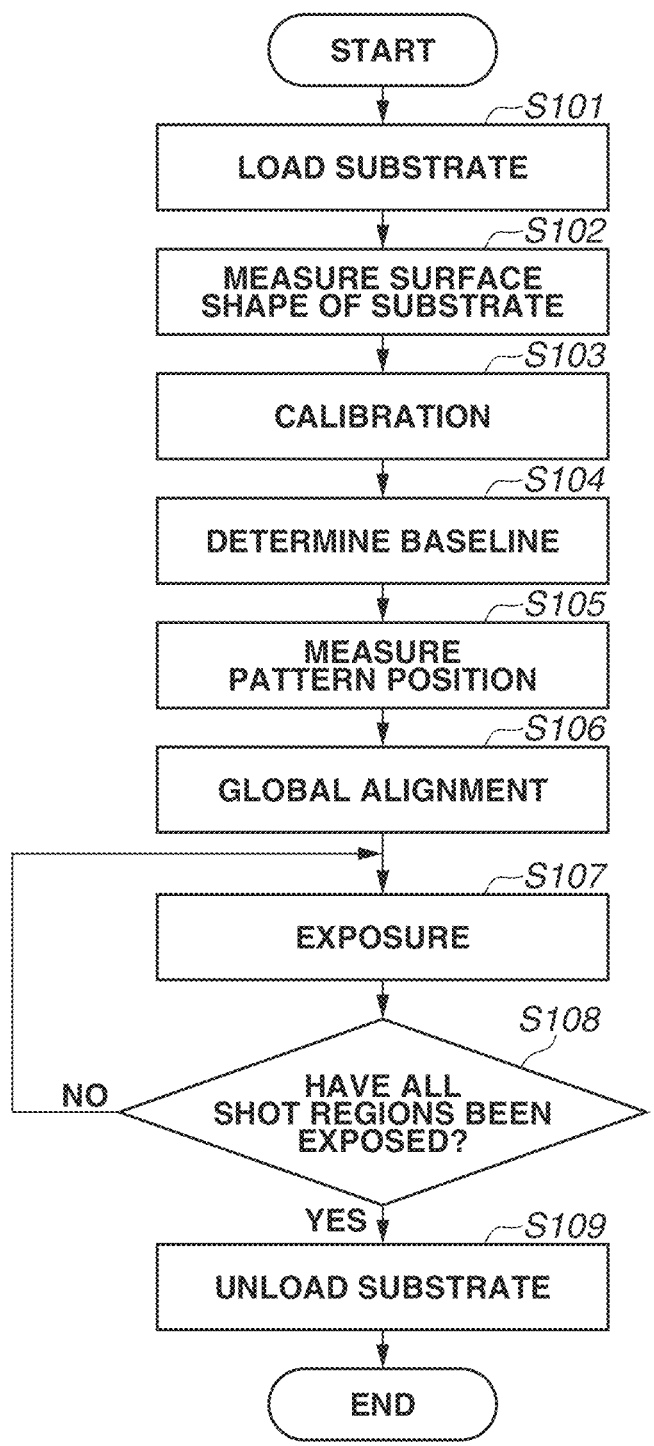
FIG. 14 is a flowchart illustrating exposure processing according to the fourth exemplary embodiment.

Next, exposure processing according to the present exemplary embodiment will be described with reference to FIG. 14. The exposure processing illustrated in FIG. 14 is performed by the control unit 1100 controlling the components of the exposure apparatus EXA in a centralized manner.

In step S101, the control unit 1100 causes the substrate 73 to be loaded into the exposure apparatus EXA. In step S102, the control unit 1100 causes a shape measurement apparatus (not illustrated) to detect the surface (height) of the substrate 73 and measure the surface shape of the entire substrate 73.

In step S103, the control unit 1100 performs calibration. More specifically, the control unit 1100 drives the substrate stage WS so that the reference mark is located on the optical axis of the measurement unit 50 based on the position of the reference mark on the reference plate 39. The control unit 1100 then measures a deviation of the reference mark from the optical axis of the measurement unit 50, and resets the coordinate system of the substrate stage WS based on the deviation so that the origin of the coordinate system of the substrate stage WS coincides with the optical axis of the measurement unit 50. Next, the control unit 1100 drives the substrate stage WS based on the positional relationship between the optical axis of the measurement unit 50 and the optical axis of the projection optical system 32 so that the reference mark is located on the optical axis of the exposure light. The control unit 1100 then causes a through-the-lens (TTL) measurement system (not illustrated) to measure a deviation of the reference mark from the optical axis of the exposure light via the projection optical system 32. In step S104, the control unit 1100 determines a baseline between the optical axis of the measurement unit 50 and the optical axis of the projection optical system 32 based on the result of the calibration in step S103.

To measure the deviation of the reference mark in step S103, the control unit 1100 performs pattern measurement processing. The control unit 1100 measures a pattern included in the reference mark using the measurement unit 50. The pattern measurement processing may be performed at regular intervals, such as at a predetermined number of times of measurement or a predetermined number of substrates 73 to be exposed.

In step S105, the control unit 1100 causes the measurement unit 50 to measure the position of the pattern 72 disposed on the substrate 73. In step S106, the control unit 1100 performs global alignment. More specifically, the control unit 1100 calculates a shift, magnification, and rotation about an array of shot regions on the substrate 73 based on the result of the measurement in step S105, and determines the regularity of the array of the shot regions. The control unit 1100 then determines correction coefficients from the regularity of the array of the shot regions and the baseline, and aligns the substrate 73 to the reticle 31 (exposure light) based on the correction coefficients.

To measure the position of the pattern 72 in step S105, the control unit 1100 performs the pattern measurement processing. The control unit 1100 measures the pattern 72 using the measurement unit 50. The pattern measurement processing may be performed at regular intervals, such as at a predetermined number of patterns to be measured or a predetermined number of substrates 73 to be exposed.

In step S107, the control unit 1100 exposes the substrate 73 to light while controlling the reticle stage RS and the substrate stage WS so that the reticle 31 and the substrate 73 are scanned in the scanning direction (Y direction). Here, the control unit 1100 drives the substrate stage WS in the Z direction and a tilt direction based on the surface shape of the substrate 73 measured by the shape measurement apparatus, so that the surface of the substrate 73 is successively brought into the focusing plane of the projection optical system 32.

In step S108, the control unit 1100 determines whether all the shot regions of the substrate 73 to be exposed have been exposed (i.e., there is any unexposed shot region among the shot regions to be exposed). If all the shot regions to be exposed are not determined to have been exposed (NO in step S108), the processing proceeds to step S107. In other words, steps S107 and S108 are repeated until all the shot regions to be exposed have been exposed. On the other hand, if all the shot regions to be exposed are determined to have been exposed (YES in step S108), the processing proceeds to step S109. In step S109, the control unit 1100 causes the substrate 73 to be unloaded from the exposure apparatus EXA.

<Method for Manufacturing Article>

A method for manufacturing an article such as a device (semiconductor device, magnetic recording medium, or liquid crystal display element), a color filter, and a hard disk will be described. The manufacturing method includes a step of forming a pattern on a substrate (such as a wafer, a glass plate, and a film-shaped substrate) using a lithographic apparatus (such as an exposure apparatus, an imprint apparatus, and a drawing apparatus). The manufacturing method further includes a step of processing the patterned substrate. This processing step can include a step of removing the residual film of the pattern. Other conventional steps such as etching the substrate using the pattern as a mask can also be included. Compared to conventional methods, the method for manufacturing an article according to the present exemplary embodiment is advantageous in at least one of the performance, quality, productivity, and production cost of the article.

According to an exemplary embodiment of the present disclosure, an illumination apparatus, a measurement apparatus, a substrate processing apparatus, and a method for manufacturing an article that prevent degradation in the performance and durability of a light source can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

While the exposure apparatus EXA has been described as an example of the substrate processing apparatus, the substrate processing apparatus is not limited thereto. Examples of the substrate processing apparatus may include an imprint apparatus that forms a pattern of imprint material on a substrate using a patterned mold (die or template). Another example of the substrate processing apparatus may be a planarization apparatus that molds a planarized composition on a substrate using a mold (planar template) having a pattern-less flat portion. Another example of the substrate processing apparatus may be an apparatus such as a drawing apparatus that patterns a substrate by drawing the pattern on the substrate with a charged particle beam (such as an electron beam and an ion beam) via a charged particle optical system.

The first to fourth exemplary embodiments can be practiced not only singly, but some of the first to fourth exemplary embodiments can be practiced in combination.

This application claims the benefit of priority from Japanese Patent Application No. 2021-157908, filed Sep. 28, 2021, which is hereby incorporated by reference herein in its entirety.

What is claimed is:

1. An illumination apparatus configured to provide illumination while changing a spectrum of light from a light source, the illumination apparatus comprising:
    an optical system configured to guide the light from the light source;
    a first wavelength variable unit configured to change a spectrum of the light from the light source by moving in a straight line direction along a first axis perpendicular to an optical axis of the optical system; and
    a second wavelength variable unit configured to change a spectrum of light from the first wavelength variable unit by moving in a straight line direction along a second axis, perpendicular to the optical axis of the optical system and different from the direction along the first axis,
    wherein the first wavelength variable unit is disposed so that a first incident surface of the first wavelength variable unit on which the light emitted from the optical system is incident is tilted in a rotation direction around the first axis, and
    wherein the second wavelength variable unit is disposed so that a second incident surface of the second wavelength variable unit on which the light emitted from the optical system via the first wavelength variable unit is incident is tilted in a rotation direction around the second axis.

2. The illumination apparatus according to claim 1,
    wherein the first wavelength variable unit is disposed so that the first incident surface is tilted by a tilt angle of $\theta_3$ with respect to a plane perpendicular to the optical axis,
    wherein $\tan(2\alpha_3) = r_3/d_3$ and $\alpha_3 \leq \theta_3 \leq 6\alpha_3$ are satisfied, where $\alpha_3$ is the tilt angle of the first incident surface with respect to the plane when the first incident surface is tilted so that a ray traveling along the optical axis is reflected by the first incident surface and passes a boundary of a coverage of the optical system, $r_3$ is an effective radius of the optical system, and $d_3$ is a distance between the optical system and the first wavelength variable unit in a direction along the optical axis,
    wherein the second wavelength variable unit is disposed so that the second incident surface is tilted by a tilt angle of $\theta_4$ with respect to the plane, and
    wherein $\tan(2\alpha_4) = r_3/d_4$ and $\alpha_4 \leq \theta_4 \leq 6\alpha_4$ are satisfied, where $\alpha_4$ is the tilt angle of the second incident surface with respect to the plane when the second incident surface is tilted so that a ray traveling along the optical axis is reflected by the second incident surface and passes the boundary of the coverage of the optical system, and $d_4$ is a distance between the optical system and the second wavelength variable unit in the direction along the optical axis.

3. The illumination apparatus according to claim 1, further comprising:
    a first moving unit configured to move the first wavelength variable unit in the straight line direction along the first axis; and
    a second moving unit configured to move the second wavelength variable unit in the straight line direction along the second axis.

4. The illumination apparatus according to claim 3,
    wherein the first moving unit is configured to move the first wavelength variable unit in a direction in which a beam diameter of the light from the optical system is minimized at the first incident surface, and
    wherein the second moving unit is configured to move the second wavelength variable unit in a direction in which a beam diameter of the light from the first wavelength variable unit is minimized at the second incident surface.

5. The illumination apparatus according to claim 1,
    wherein the first wavelength variable unit is located at a first focusing position at which the light from the optical system is focused, and
    wherein the second wavelength variable unit is located at a second focusing position at which the light from the first wavelength variable unit is focused.

6. The illumination apparatus according to claim 1,
wherein the first wavelength variable unit is disposed so that the first incident surface of the first wavelength variable unit is tilted in the rotation direction around the first axis so as to reduce light reflected by the first incident surface and incident on the light source, and
wherein the second wavelength variable unit is disposed so that the second incident surface of the second wavelength variable unit is tilted in the rotation direction around the second axis so as to reduce light reflected by the second incident surface and incident on the light source.

7. The illumination apparatus according to claim 1,
wherein the first wavelength variable unit includes a wavelength variable element configured to change the spectrum of the light from the optical system based on a position on which the light from the optical system is incident in the straight line direction along the first axis, and
wherein the second wavelength variable unit includes a wavelength variable element configured to change the spectrum of the light from the first wavelength variable unit based on a position on which the light from the first wavelength variable unit is incident in the straight line direction along the second axis.

8. A measurement apparatus configured to measure a position of a pattern, the measurement apparatus comprising:
an optical system configured to guide light from a light source;
a first wavelength variable unit configured to change a spectrum of the light from the light source by moving in a straight line direction perpendicular to an optical axis of the optical system; and
a second wavelength variable unit configured to change a spectrum of light from the first wavelength variable unit by moving in a straight line direction along a second axis, perpendicular to the optical axis of the optical system and different from the direction along the first axis,
wherein the first wavelength variable unit is disposed so that a first incident surface of the first wavelength variable unit on which the light emitted from the optical system is incident is tilted in a rotation direction around the first axis, and
wherein the second wavelength variable unit is disposed so that a second incident surface of the second wavelength variable unit on which the light emitted from the optical system via the first wavelength variable unit is incident is tilted in a rotation direction around the second axis of the second wavelength variable unit.

9. The measurement apparatus according to claim 8,
wherein the first wavelength variable unit is disposed so that the first incident surface is tilted by a tilt angle of $\theta_3$ with respect to a plane perpendicular to the optical axis,
wherein $\tan(2\alpha_3) = r_3/d_3$ and $\alpha_3 \leq \theta_3 \leq 6\alpha_3$ are satisfied, where $\alpha_3$ is the tilt angle of the first incident surface with respect to the plane when the first incident surface is tilted so that a ray traveling along the optical axis is reflected by the first incident surface and passes a boundary of a coverage of the optical system, $r_3$ is an effective radius of the optical system, and $d_3$ is a distance between the optical system and the first wavelength variable unit in a direction along the optical axis,
wherein the second wavelength variable unit is disposed so that the second incident surface is tilted by a tilt angle of $\theta_4$ with respect to the plane, and
wherein $\tan(2\alpha_4) = r_3/d_4$ and $\alpha_4 \leq \theta_4 \leq 6\alpha_4$ are satisfied, where $\alpha_4$ is the tilt angle of the second incident surface with respect to the plane when the second incident surface is tilted so that a ray traveling along the optical axis of the optical system is reflected by the second incident surface and passes the boundary of the coverage of the optical system, and $d_4$ is a distance between the optical system and the second wavelength variable unit in the direction along the optical axis.

10. The illumination apparatus according to claim 8, further comprising:
a first moving unit configured to move the first wavelength variable unit in a straight line direction along the first axis; and
a second moving unit configured to move the second wavelength variable unit in the straight line direction along the second axis.

11. The measurement apparatus according to claim 8,
wherein the first moving unit is configured to move the first wavelength variable unit in a direction in which a beam diameter of the light from the optical system is minimized at the first incident surface, and
wherein the second moving unit is configured to move the second wavelength variable unit in a direction in which a beam diameter of the light from the first wavelength variable unit is minimized at the second incident surface.

12. A substrate processing apparatus configured to process a substrate on which a pattern is formed, the substrate processing apparatus comprising a measurement apparatus configured to measure a position of the pattern and being configured to process the substrate aligned based on the position of the pattern measured by the measurement apparatus,
the measurement apparatus including:
an optical system configured to guide light from a light source;
a first wavelength variable unit configured to change a spectrum of the light from the light source by moving in a straight line direction along a first axis perpendicular to an optical axis of the optical system; and
a second wavelength variable unit configured to change a spectrum of light from the first wavelength variable unit by moving in a straight line direction along a second axis, perpendicular to the optical axis of the optical system and different from the direction along the first axis,
wherein the first wavelength variable unit is disposed so that a first incident surface of the first wavelength variable unit on which the light emitted from the optical system is incident is tilted in a rotation direction around the first axis, and
wherein the second wavelength variable unit is disposed so that a second incident surface of the second wavelength variable unit on which the light emitted from the optical system via the first wavelength variable unit is incident is tilted in a rotation direction around the second axis.

13. A method for manufacturing an article, comprising:
processing a substrate using a substrate processing apparatus configured to process a substrate on which a pattern is formed; and manufacturing the article from the processed substrate,
wherein the substrate processing apparatus includes a measurement apparatus configured to measure a position of the pattern and is configured to process the substrate aligned based on the position of the pattern measured by the measurement apparatus,
wherein the measurement apparatus includes
an optical system configured to guide light from a light source;
a first wavelength variable unit configured to change a spectrum of light from the optical system by moving in a straight line direction along a first axis perpendicular to an optical axis of the optical system; and
a second wavelength variable unit configured to change a spectrum of light from the first wavelength variable unit by moving in a straight line direction along a second axis, perpendicular to the optical axis of the optical system and different from the direction along the first axis,
wherein the first wavelength variable unit is disposed so that a first incident surface of the first wavelength variable unit on which the light emitted from the optical system is incident is tilted in a rotation direction around the first axis, and
wherein the second wavelength variable unit is disposed so that a second incident surface of the second wavelength variable unit on which the light emitted from the optical system via the first wavelength variable unit is incident is tilted in a rotation direction around the second axis.

* * * * *